United States Patent [19]
Yoshikawa et al.

[11] Patent Number: 5,384,473
[45] Date of Patent: Jan. 24, 1995

[54] SEMICONDUCTOR BODY HAVING ELEMENT FORMATION SURFACES WITH DIFFERENT ORIENTATIONS

[75] Inventors: Susumu Yoshikawa; Akira Sudo, both of Yokohama, Japan

[73] Assignee: Kabushiki Kaisha Toshiba, Kawasaki, Japan

[21] Appl. No.: 953,808

[22] Filed: Sep. 30, 1992

[30] Foreign Application Priority Data

Oct. 1, 1991 [JP] Japan .................. 3-253899

[51] Int. Cl.6 .................. H01L 27/02; H01L 29/04; H01L 27/04
[52] U.S. Cl. .................. 257/255; 257/369; 257/371; 257/374; 257/513; 257/627
[58] Field of Search .............. 257/255, 369, 371, 374, 257/401, 521, 527, 627, 513

[56] References Cited

U.S. PATENT DOCUMENTS

| | | | |
|---|---|---|---|
| 3,476,991 | 11/1969 | Mize et al. | 257/255 |
| 3,603,848 | 9/1971 | Sato et al. | 257/627 |
| 3,612,960 | 10/1971 | Takeishi et al. | 257/627 |
| 3,634,737 | 1/1972 | Maeda et al. | 257/255 |
| 4,768,076 | 8/1988 | Aoki et al. | 257/369 |
| 4,857,986 | 8/1989 | Kinugawa | 257/255 |
| 4,878,957 | 11/1989 | Yamaguchi et al. | 257/627 |

Primary Examiner—Gene M. Munson
Attorney, Agent, or Firm—Banner, Birch, McKie & Beckett

[57] ABSTRACT

A semiconductor body has a first and a second element formation surface. The semiconductor body is constructed in such a manner that a first semiconductor substrate, which has a first main surface at which the plane appears, is laminated to a second semiconductor substrate, which has a second main surface at which the plane appears. Made in the first semiconductor substrate is at least one opening at which the second main surface of the second semiconductor substrate. The first main surface of the first semiconductor substrate becomes the first element formation surface of the semiconductor body, and the second main surface of the second semiconductor substrate becomes the second element formation surface of the body.

13 Claims, 24 Drawing Sheets

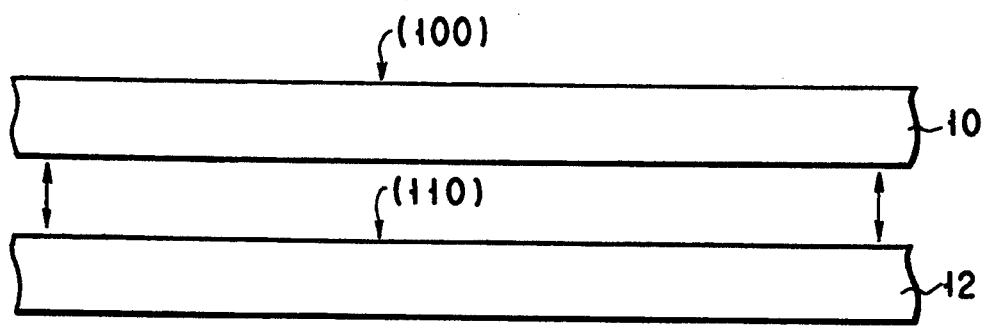
F I G. 1A
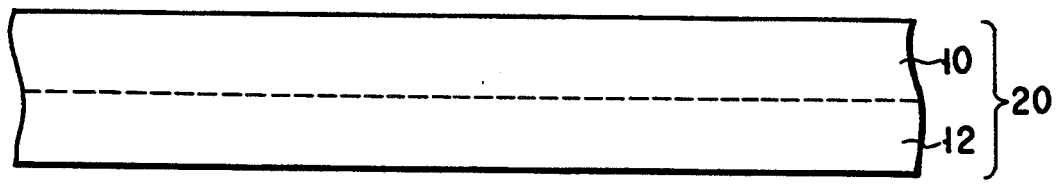
F I G. 1B
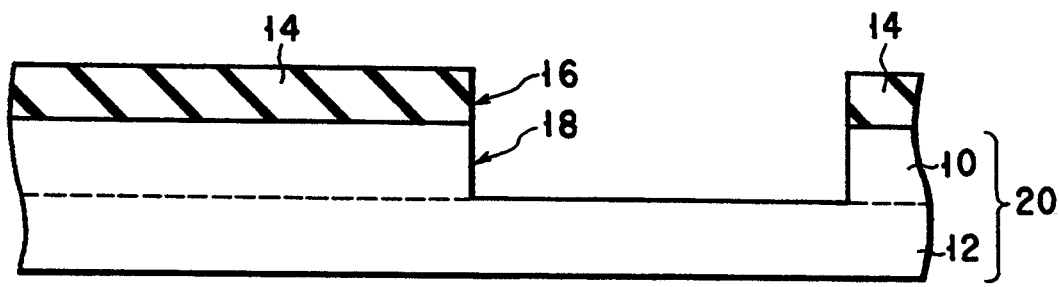
F I G. 1C

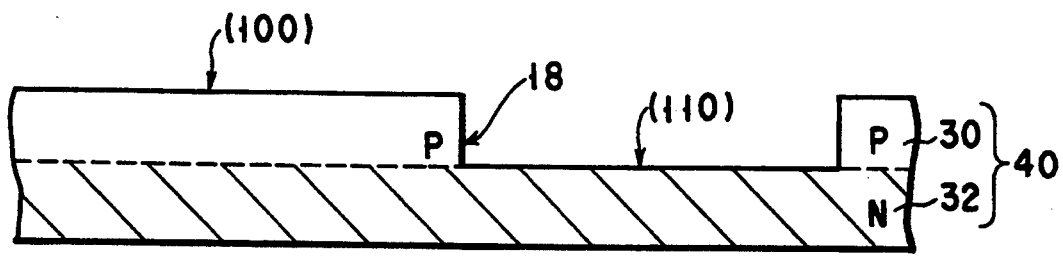
F I G. 2D
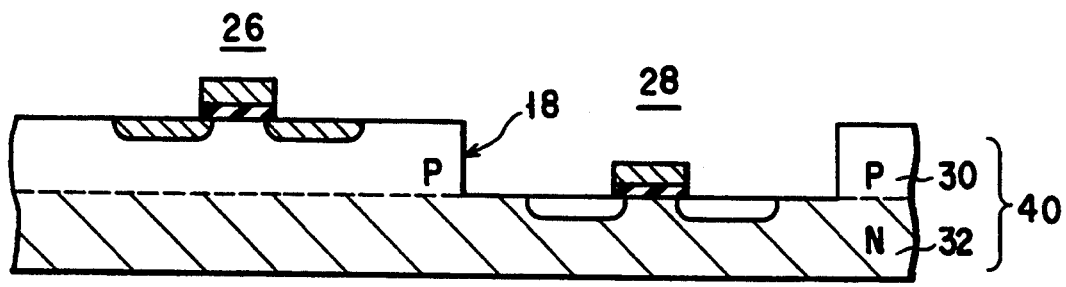
F I G. 2E
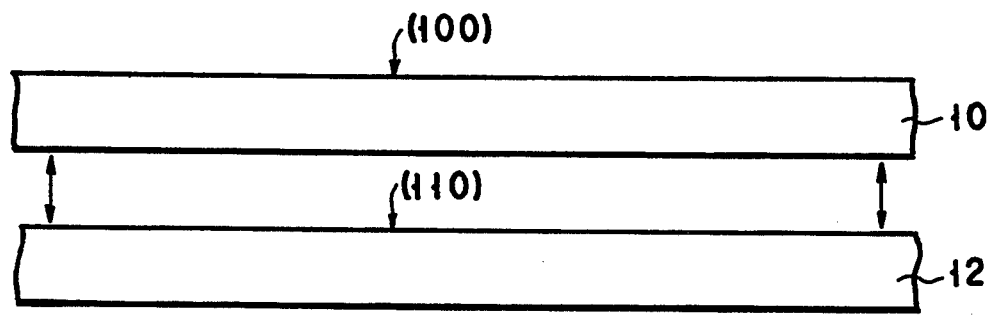
F I G. 3A

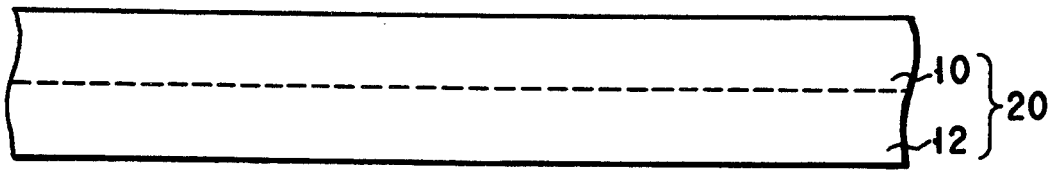
F I G. 3B
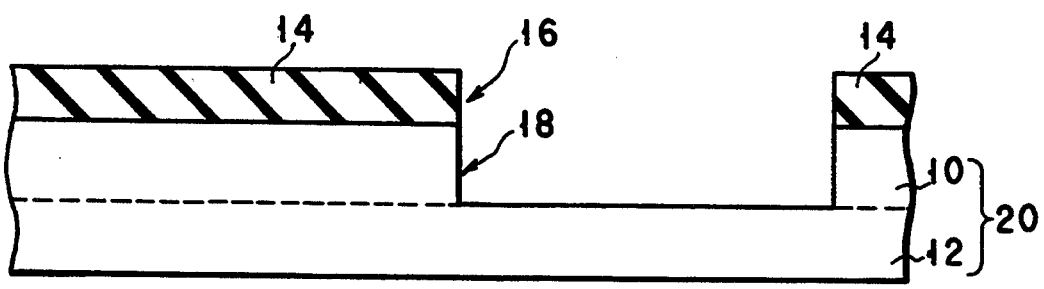
F I G. 3C
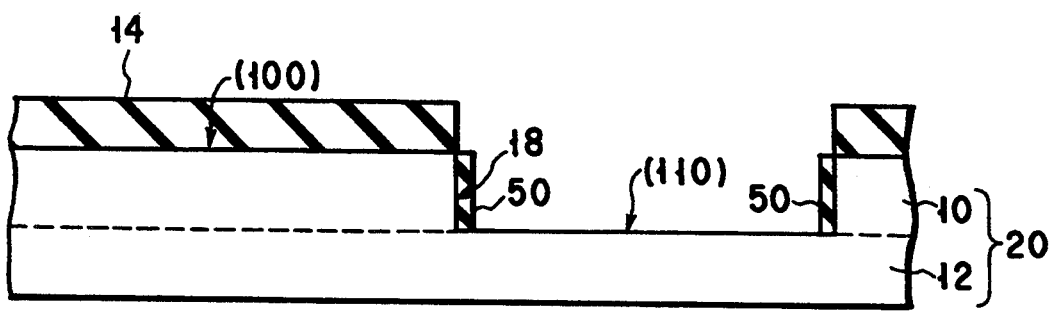
F I G. 3D

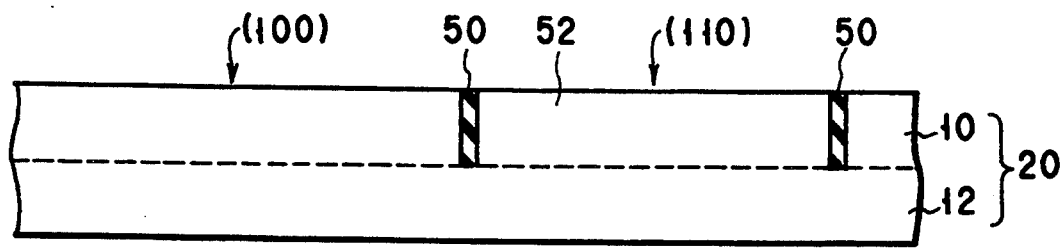
F I G. 3E
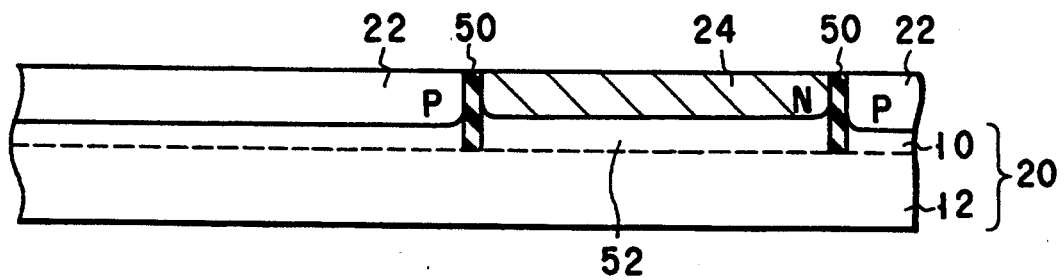
F I G. 3F
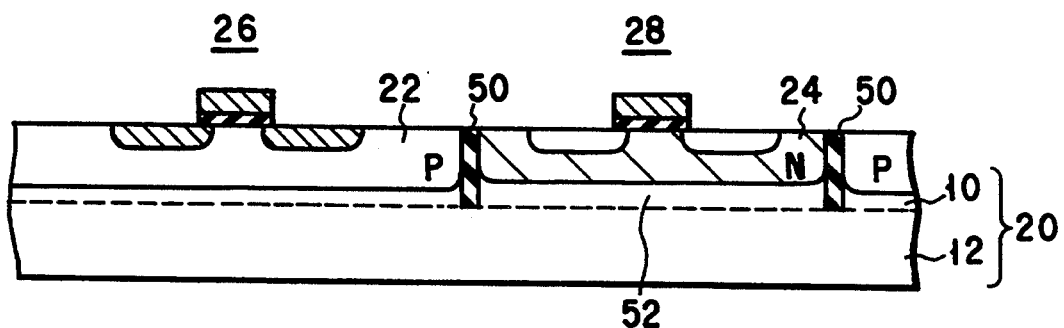
F I G. 3G

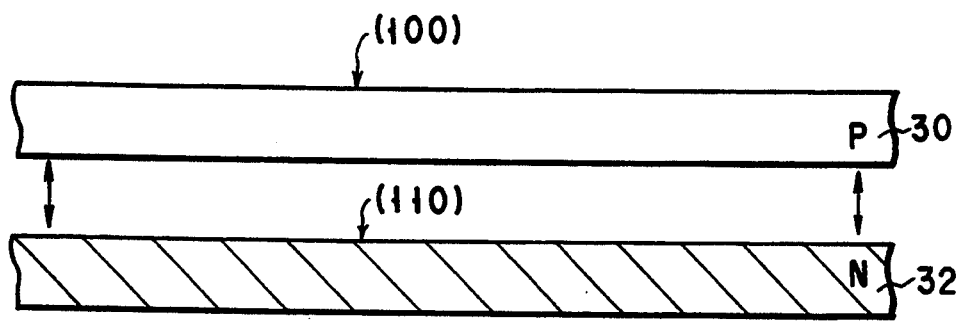
F I G. 4A
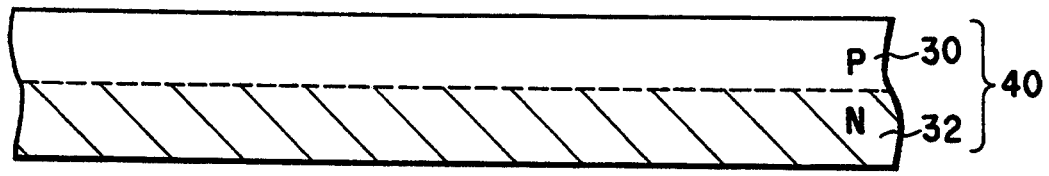
F I G. 4B
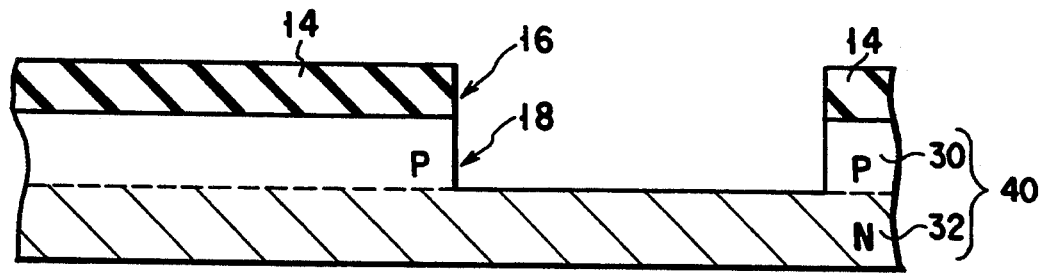
F I G. 4C

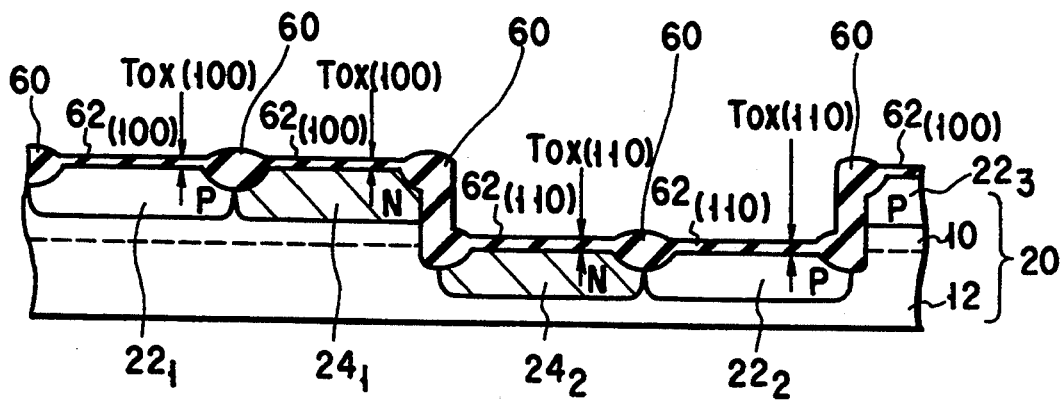
F I G. 5D
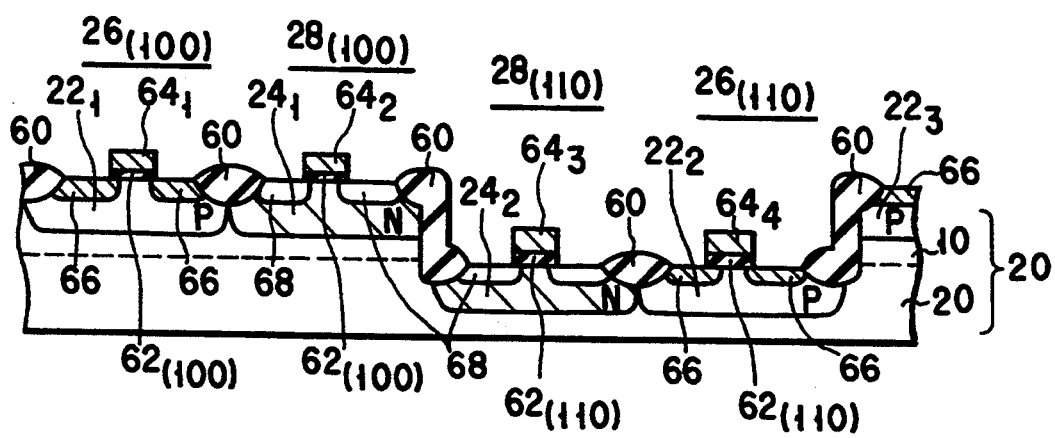
F I G. 5E

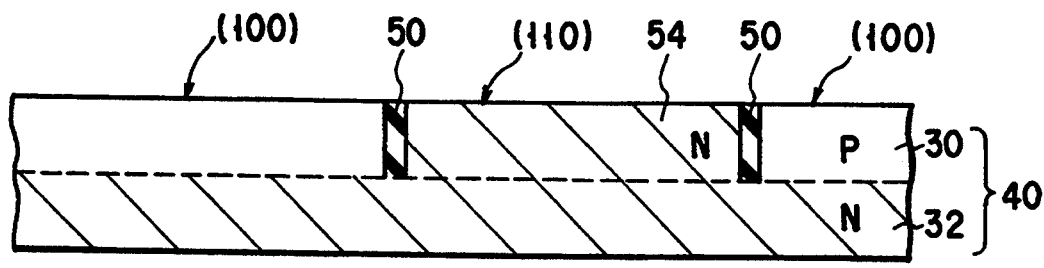
F I G. 9A
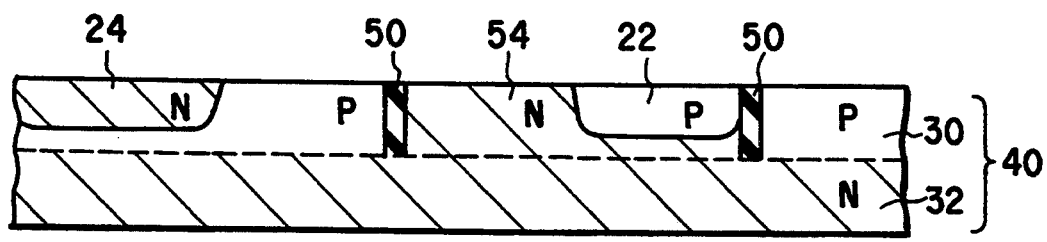
F I G. 9B
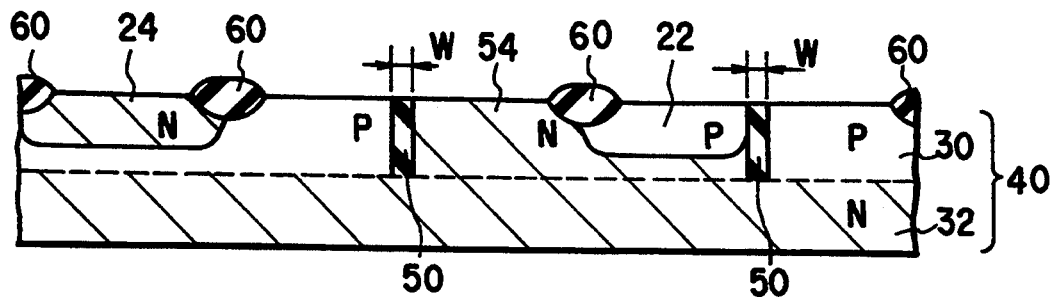
F I G. 9C

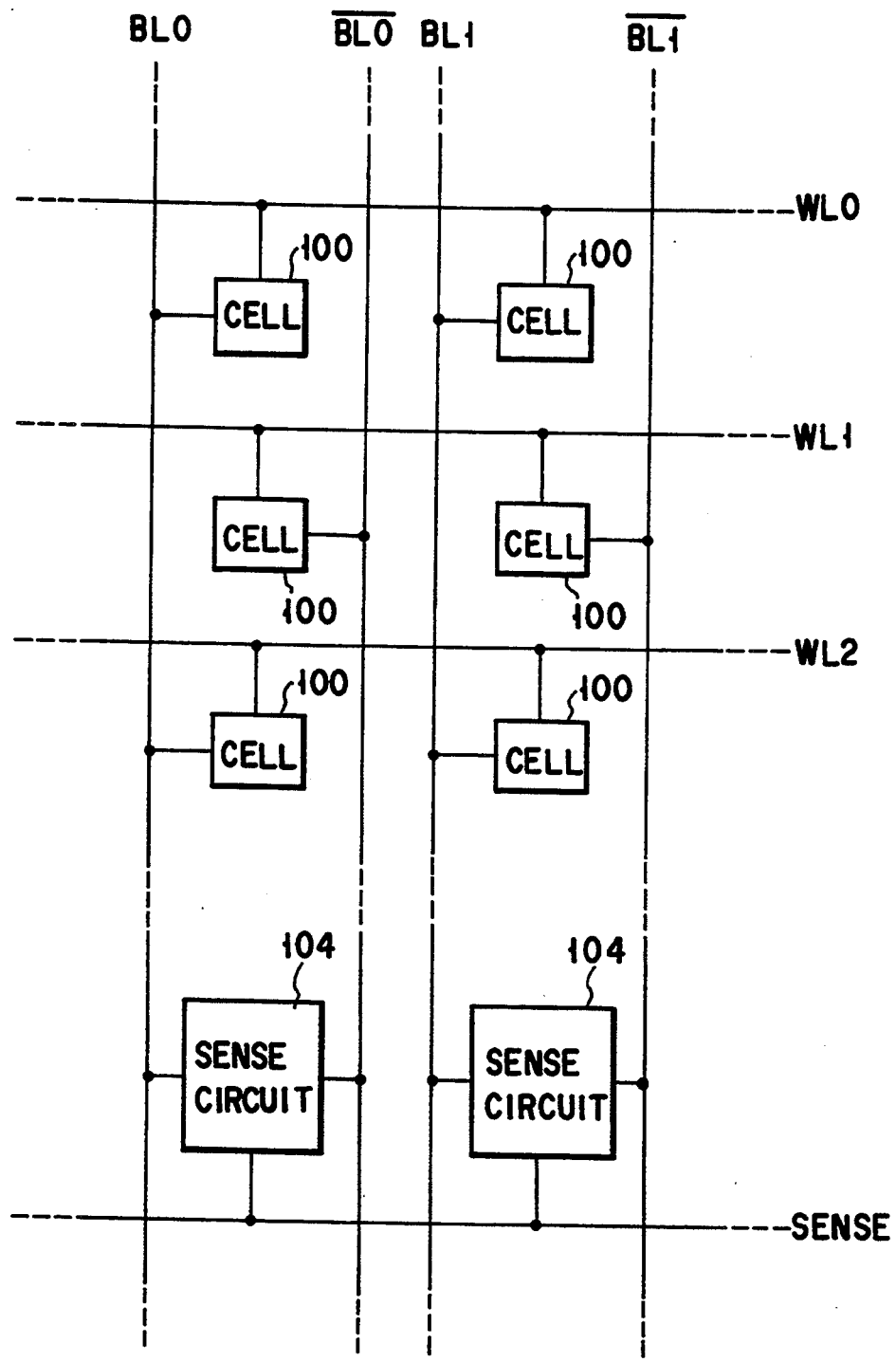
F I G. 11

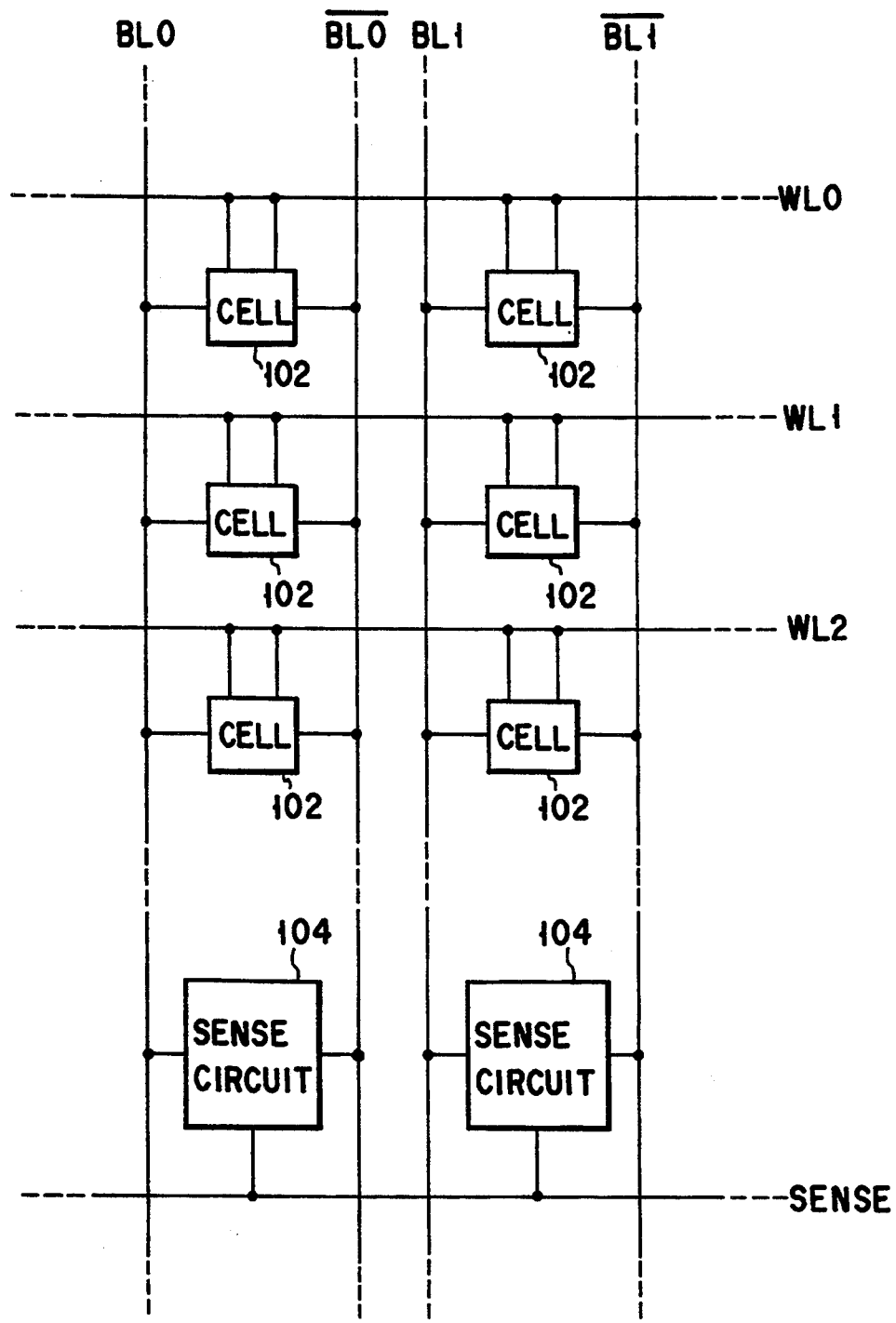
F I G. 12

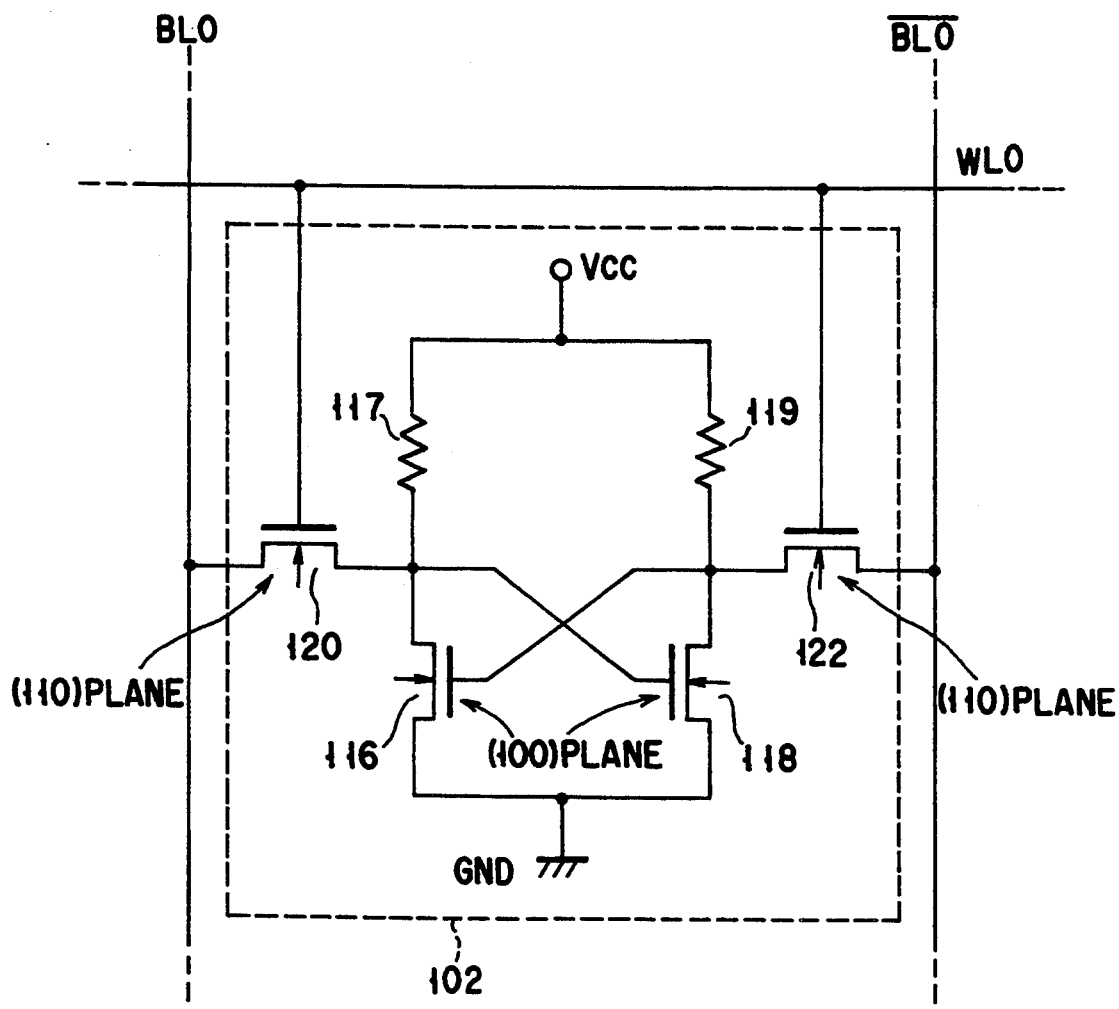
F I G. 14

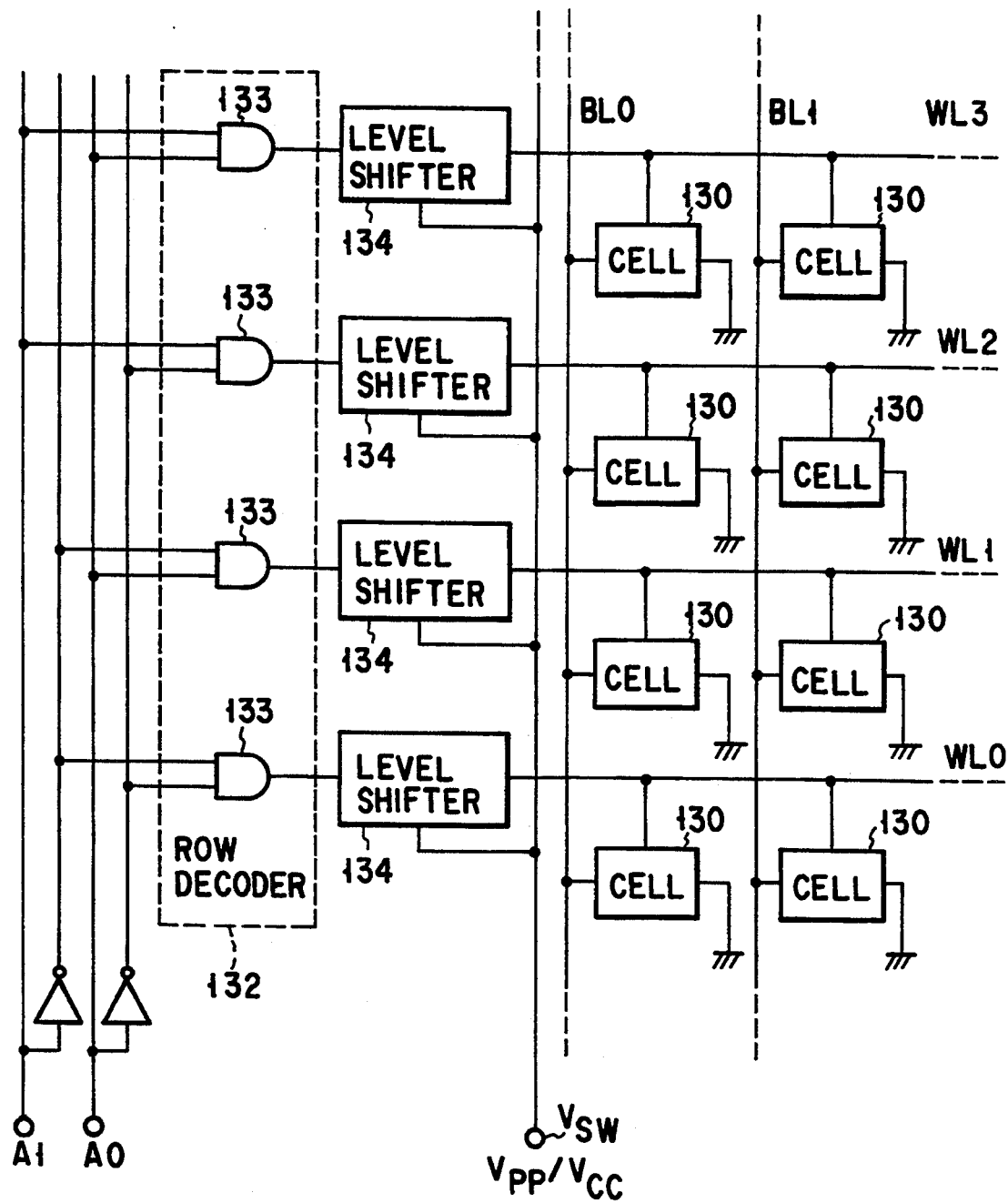
F I G. 16

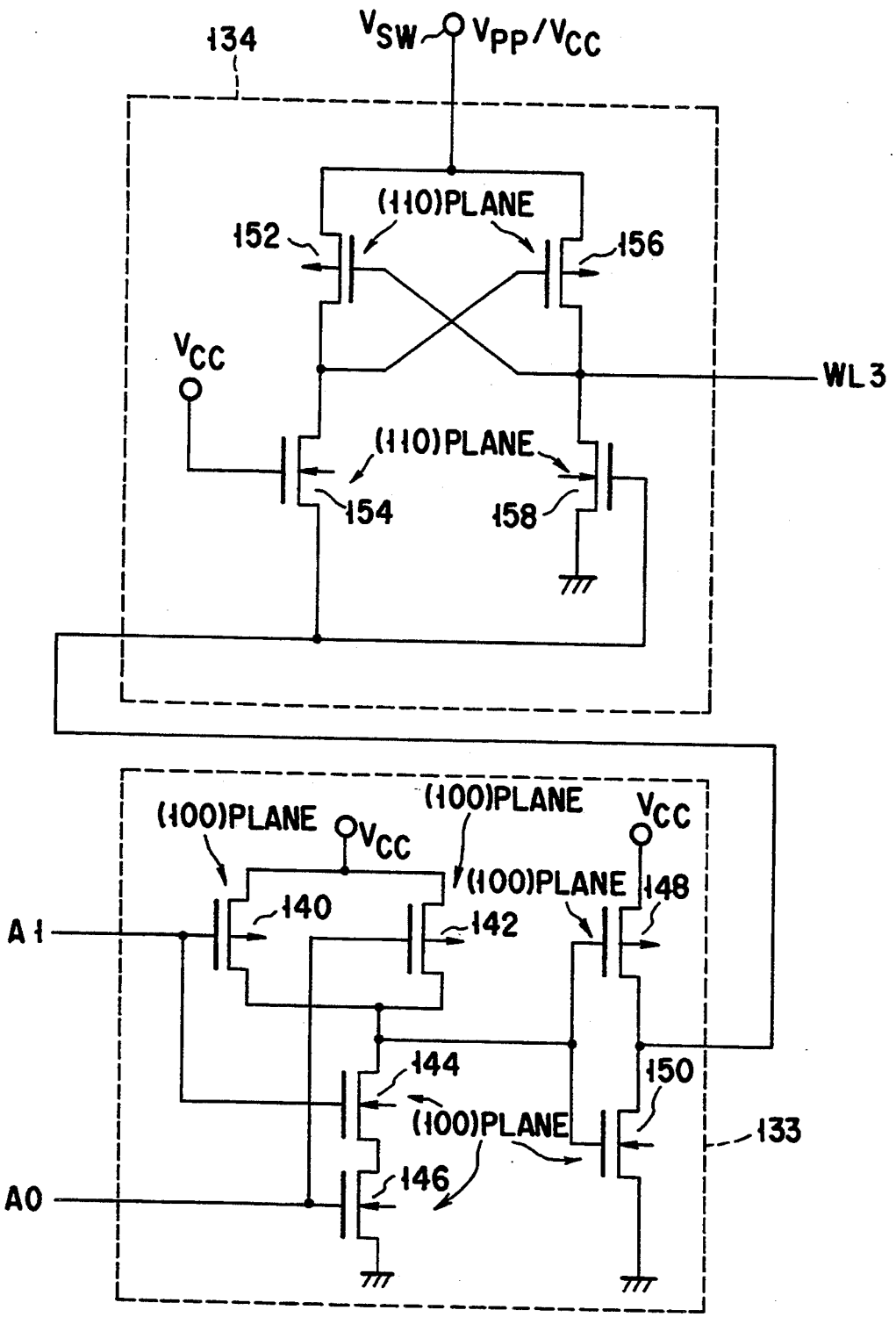
F I G. 17

SEMICONDUCTOR BODY HAVING ELEMENT FORMATION SURFACES WITH DIFFERENT ORIENTATIONS

BACKGROUND OF THE INVENTION

1. Field of the Invention

This invention relates to a semiconductor body, its manufacturing method, and a semiconductor device using the body, and more particularly to a semiconductor body capable of optimizing the performance and characteristics of active elements.

2. Description of the Related Art

In a semiconductor device in which CMOS integrated circuits are packed, the n-channel MOSFET (hereinafter, referred to as the NMOS) and the p-channel MOSFET (hereinafter, referred to as the PMOS) are formed on the same substrate. For this type of device, there has been no substrate structure yet that allows the NMOS and PMOS to achieve their best performance.

The related technical literature includes M. Kinugawa et al., IEDM Tech, Dig. p.581, 1985.

SUMMARY OF THE INVENTION

The MOS transistor's characteristics including transconductance and reliability depend on the surface orientation of the substrate. Thus, it is impossible to optimize the performance and characteristics of semiconductor elements in the present-day semiconductor substrate (body). That is, CMOS semiconductor devices forming present-day NMOS and PMOS transistors have not yet drawn their maximum performance.

Accordingly, the object of the present invention is to provide a semiconductor body capable of allowing semiconductor elements of different conductivity types not only to simultaneously display their full performance but also to form semiconductor elements with the optimum characteristics into a device, its manufacturing method, and a semiconductor device using the body.

To attain the foregoing object, a semiconductor body of the present invention contains a portion having a first surface orientation, and a portion having a second surface orientation almost parallel to the first portion.

Because the semiconductor body has the first surface orientation portion and the second orientation portion almost parallel to the first portion, forming semiconductor elements of different conductivity types in the first and second surface orientation portions, respectively, makes it possible to maximize the performance of those semiconductor elements of different conductivity types at the same time.

The semiconductor element formed in the first surface orientation portion differs from that in the second surface orientation portion in the performance and characteristics. This makes it possible to form semiconductor elements with the optimum characteristics into a semiconductor device by forming the semiconductor element either in the first or the second surface orientation portion, depending on the requirements.

The semiconductor device thus formed has several advantages such as the improved performance.

A concrete method of forming the above semiconductor body is first to prepare a first semiconductor substrate whose main surface has a first surface orientation, and a second semiconductor substrate whose main surface has a second surface orientation, and then laminate the main surface of the first semiconductor substrate to that of the second semiconductor substrate, and finally make at least one opening in the first semiconductor substrate so that the second semiconductor substrate may be exposed.

Growing an epitaxial semiconductor layer in the opening allows the first surface orientation portion to be almost flush with the second surface orientation portion. With the semiconductor body thus formed, the step gap between the first and second surface orientation portions is alleviated. Therefore, this body has the advantage of facilitating the connection of semiconductor elements by the interconnection layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1A to 1F are sectional views in the manufacturing sequence of a semiconductor device according to a first embodiment of the present invention;

FIGS. 2A to 2F are sectional views in the manufacturing sequence of a semiconductor device according to a second embodiment of the present invention;

FIGS. 3A to 3G are sectional views in the manufacturing sequence of a semiconductor device according to a third embodiment of the present invention;

FIGS. 4A to 4F are sectional views in the manufacturing sequence of a semiconductor device according to a fourth embodiment of the present invention;

FIGS. 5A to 5E are sectional views in the manufacturing sequence of a semiconductor device according to a fifth embodiment of the present invention;

FIGS. 9A to 9E are sectional views in the manufacturing sequence of a semiconductor device according to a ninth embodiment of the present invention;

FIG. 11 is a block diagram of a memory cell portion of a dynamic RAM;

FIG. 12 is a block diagram of a memory cell portion of a static RAM;

FIG. 14 is a circuit diagram of the static memory cell of FIG. 12;

FIG. 16 is a block diagram of a memory cell portion and a row decoder portion of the programmable ROM;

FIG. 17 is a circuit diagram of the AND gate and level shifter of FIG. 16; and

DETAILED DESCRIPTION OF THE PREFERRED EMBODIMENTS

Figure 1D:
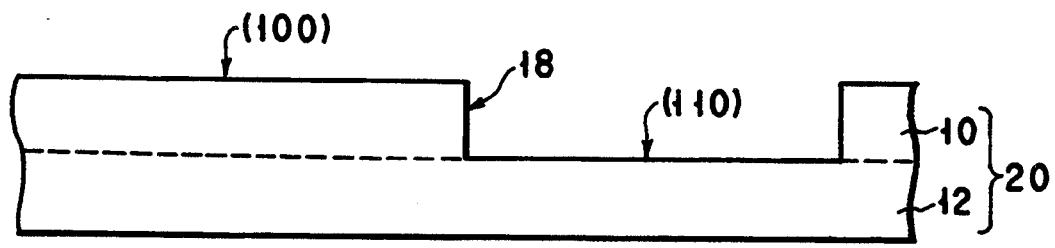

Referring to the accompanying drawings, embodiments of the present invention will be explained. The like parts are indicated by the corresponding reference characters throughout the drawings, and their repetitive explanation will be omitted.

FIGS. 1A to 1F are sectional views in the manufacturing sequence of a semiconductor device according to a first embodiment of the present invention.

First prepared are a single-crystal silicon substrate (wafer) 10 in which the (100) plane appears at the main surface and a single-crystal silicon substrate (wafer) 12 in which the (110) plane comes out to the main surface (FIG. 1A).

Then, the substrate 10 is laminated to the substrate 12 to form a silicon body 20 (FIG. 1B). The lamination of those two substrates is carried out by, for example, planishing adhesion techniques.

Next, on the main surface of the silicon substrate 10, a mask material 14 made of, for example, a silicon oxide film is deposited. A photoresist (not shown) is applied over the mask material 14 to form a photoresist layer. Patterning is done on the photoresist layer by the photoetching method to make a window in the photoresist layer in order to form an opening.

The mask material 14 is then etched, using the photoresist layer as a mask. This forms a window 16 in the mask material 14 at which the main surface of the substrate 10 is exposed. With the mask material 14 as a mask, the substrate 10 is etched to form an opening 18 that allows the main surface of the substrate 12 to be exposed (FIG. 1C).

To facilitate the formation of the opening 18, before or after the lamination process of FIG. 1B, the substrate 10 may be polished to reduce its film thickness.

Next, the mask material 14 is removed. After those processes have been completed, the silicon body 20 has portions of different surface orientations: a portion where the (100) plane is exposed and a portion where the (110) plane is exposed. Since these planes are almost parallel to each other, semiconductor elements can be formed at the (100) plane and the (110) plane, in the same manner as with a normal wafer (FIG. 1D).

Figure 1E:
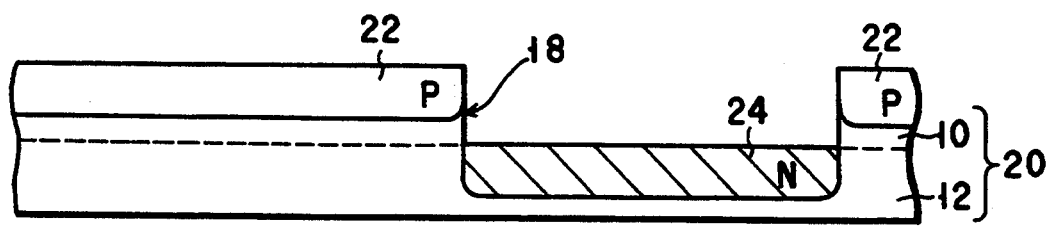

Then, with a photoresist (not shown) as a mask, p-type impurities are introduced into the substrate 10 with the (100) surface orientation. By using a new photoresist (not shown) as a mask, n-type impurities are then introduced into the substrate 12 with the (110) surface orientation. Next, the introduced impurities are activated to form a p-type well 22 in the substrate 10, and an n-type well 24 in the substrate 12 (FIG. 1E).

Figure 1F:
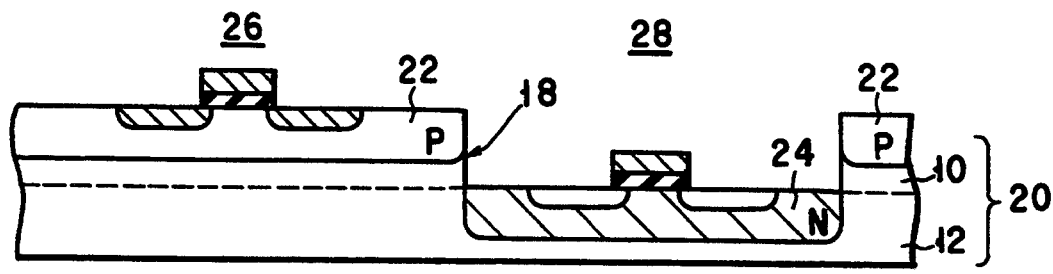

Then, an NMOS 26 is formed in the p-type well 22, and a PMPS 28 is formed in the n-type well 24. This completes the semiconductor device of the first embodiment (FIG. 1F).

As described above, with the first embodiment, the silicon body 20 has a plurality of different surface orientation portions, in which NMOSes and PMOSes are formed so as to achieve their maximum performance, thereby providing a high-performance semiconductor device. As an example in the first embodiment, a PMOS is formed in the substrate 10 with the (100) surface orientation, and an NMOS is formed in the substrate 12 with the (110) surface orientation.

Packing such semiconductor devices into an integrated circuit provides a high-performance semiconductor integrated circuit device.

FIGS. 2A to 2E are sectional views in the manufacturing sequence of a semiconductor device according to a second embodiment of the present invention.

Figure 2A:
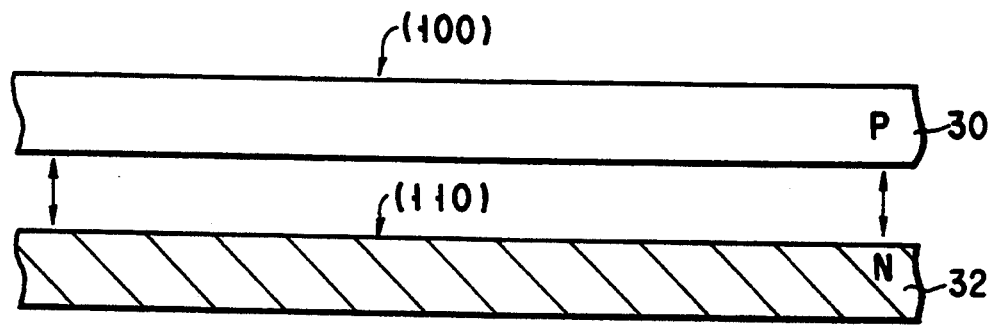

First prepared are a p-type single-crystal silicon substrate (wafer) 30 in which the (100) plane comes out to the main surface and an n-type single-crystal silicon substrate (wafer) 32 in which the (110) plane appear at the main surface (FIG. 2A).

Figure 2B:
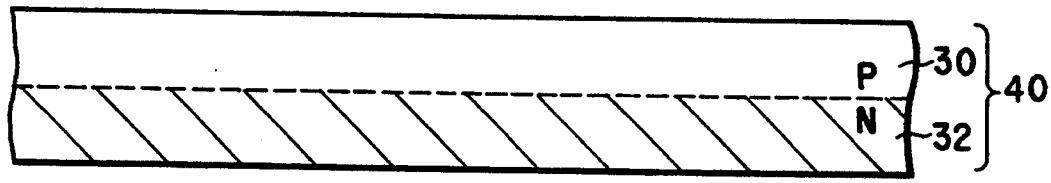

Then, the substrate 30 is laminated to the substrate 32 by, for example, planishing adhesion techniques to form a silicon body 40 (FIG. 2B).

Figure 2C:
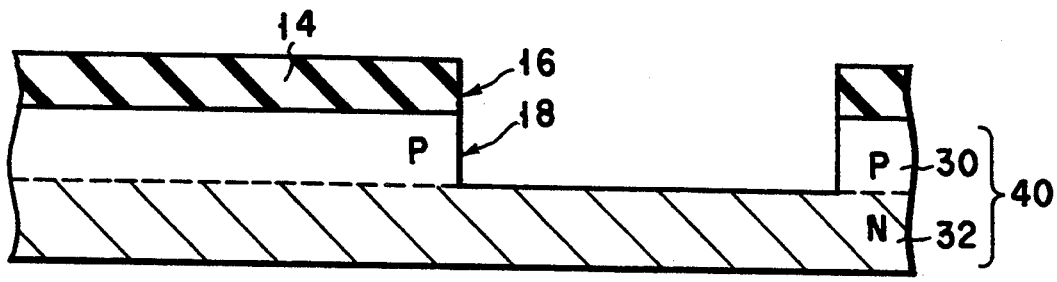

Next, by the same method as explained in FIG. 1C, a mask material 14 with a window, composed of, for example, a silicon oxide film, is formed on the p-type substrate 30. With the mask material 14 as a mask, the p-type substrate 30 is etched to make an opening 18 that allows the main surface of the n-type substrate 32 to appear at the bottom (FIG. 2C).

Then, the mask material 14 is removed. After those processes have been completed, the silicon body 40 has portions of different surface orientations: a portion with the (100) plane and a portion with the (110) plane. Further, in the present embodiment, the portions of different surface orientations are of different conductivity types (FIG. 2D).

Next, an NMOS 26 is formed in the p-type substrate 30, and a PMOS 28 is formed in the n-type substrate 32. This completes the semiconductor device of the second embodiment (FIG. 2E).

With the second embodiment, as with the first embodiment, by forming the NMOS and PMOS in the portions with surface orientations that enable their best performance to be achieved, a high-performance semiconductor device can be made. Making the conductivity types of the two substrate 30 and 32 different permits the omission of the well formation process, simplifying the manufacturing processes.

FIGS. 3A to 3G are sectional views in the manufacturing sequence of a semiconductor device according to a third embodiment of the present invention.

First prepared are a single-crystal silicon substrate (wafer) 10 in which the (100) plane comes out to the main surface and a single-crystal silicon substrate (wafer) 12 in which the (110) plane appear at the main surface (FIG. 3A).

Then, the substrate 10 is laminated to the substrate 12 by, for example, planishing adhesion techniques to form a silicon body 20 (FIG. 3B).

Next, by the same method as explained in FIG. 1C, a mask material 14 is formed on the substrate 10. With the mask material 14 as a mask, the substrate 10 is etched to make an opening 18 that allows the main surface of the substrate 12 to appear at the bottom (FIG. 3C).

Then, a sidewall 50 made of, for example, a silicon nitride film is formed on the side of the opening 18. This sidewall 50 is created by forming, for example, a nitride film over the substrates 10 and 12, and etching the nitride film by RIE or anistropic etching techniques to leave a nitride film in the form of a sidewall on the side of the opening 18 (FIG. 3D).

Next, by using the mask material 14 as a mask, an epitaxial silicon layer 52 is grown on the substrate 12 exposed at the bottom of the opening 18. The epitaxial silicon layer 52 is formed by a selective epitaxial growth (hereinafter, referred to as SEG) method that uses the substrate 12 as seed crystal. This permits the plane whose surface orientation is the same as that of the main surface of the substrate 12, or the (110) plane to appear at the surface of the epitaxial silicon layer 52. Here, by controlling the thickness of the epitaxial silicon layer 52 to be grown, the surface of the epitaxial silicon layer 52 can be made almost flush with the surface of the substrate 10. Therefore, the silicon body 20 has portions of different surface orientations: a portion with the (100) plane and a portion with the (110) plane. Further, in the body 20 of the present embodiment, those portions of different surface orientations can be made flush with each other. The mask material 14 is then removed from over the substrate 10 (FIG. 3E).

Then, with a photoresist (not shown) as a mask, p-type impurities are introduced into the substrate 10 with the (100) surface orientation. By using a new photoresist (not shown) as a mask, n-type impurities are then introduced into the epitaxial silicon layer 52 with the (110) surface orientation. Next, the introduced impurities are activated to form a p-type well 22 in the substrate 10, and an n-type well 24 in the epitaxial silicon layer 52 (FIG. 3F).

Then, an NMOS 26 is formed in the p-type well 22, and a PMPS 28 is formed in the n-type well 24. This completes the semiconductor device of the third embodiment (FIG. 3G).

The semiconductor device of the third embodiment has the same effects as the first embodiment does. It also provides the silicon body that enables the portions of different surface orientations to be almost flush with each other. As a result, with the body of FIG. 3E, the step gap between the portions of different surface orientations can be alleviated, which facilitates the connection of semiconductor elements by the interconnection layer.

FIGS. 4A to 4F are sectional views in the manufacturing sequence of a semiconductor device according to a fourth embodiment of the present invention.

First prepared are a p-type single-crystal silicon substrate (wafer) 30 in which the (100) plane comes out to the main surface and an n-type single-crystal silicon substrate (wafer) 32 in which the (110) plane appear at the main surface (FIG. 4A).

Then, the p-type substrate 30 is laminated to the n-type substrate 32 by, for example, planishing adhesion techniques to form a silicon body 40 (FIG. 4B).

Next, by the same method as explained in FIG. 1C, a mask material 14 is formed on the substrate 30. With the mask material 14 as a mask, the substrate 30 is etched to make an opening 18 that allows the main surface of the substrate 32 to appear at the bottom (FIG. 4C).

Figure 4D:
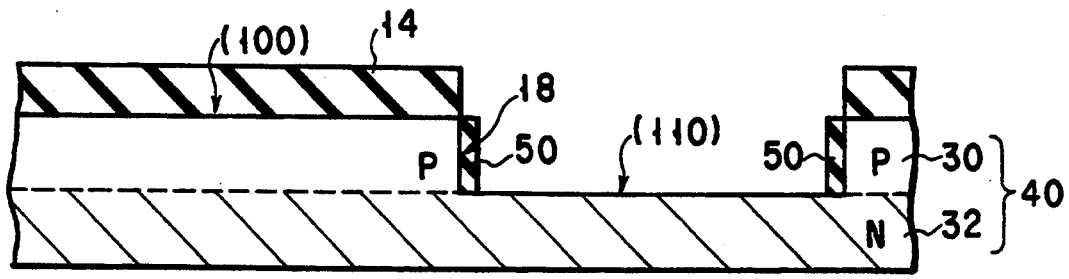

Then, a sidewall 50 made of, for example, a silicon nitride film is formed on the side of the opening 18, in the same manner as explained in FIG. 3D (FIG. 4D).

Figure 4E:
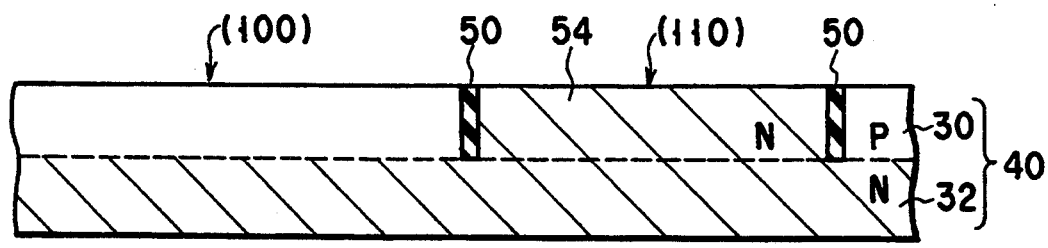

Next, by the same method as described in FIG. 3E, that is, by the SEG method using the mask material 14 as a mask, an n-type epitaxial silicon layer 54 is grown on the substrate 12 exposed at the bottom of the opening 18. After those processes have finished, the silicon body 40 has portions of different surface orientations: a portion with the (100) plane and a portion with the (110) plane. Further, in the body 40 of the present embodiment, those portions of different surface orientations are of different conductivity types and can be made flush with each other. The mask material 14 is then removed from over the substrate 30 (FIG. 4E).

Figure 4F:
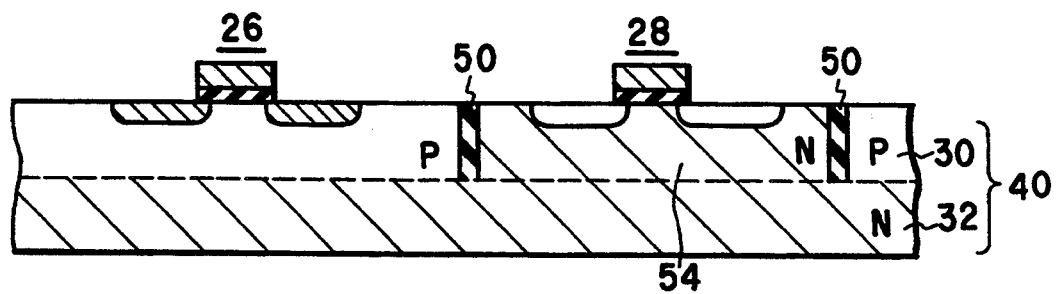

Then, an NMOS 26 is formed in the p-type substrate 30, and a PMPS 28 is formed in the n-type epitaxial layer 54. This completes the semiconductor device of the fourth embodiment (FIG. 4F).

The semiconductor device of the fourth embodiment provides the silicon body 40 that enables the portions of different surface orientations to be of different conductivity types and be almost flush with each other. This makes it possible to alleviate the step gap between the portions of different surface orientations, which facilitates the connection of semiconductor elements by the interconnection layer. Further, the arrangement of different surface orientation portions being of different conductivity types makes it possible to omit the well formation process.

FIGS. 5A to 5E are sectional views in the manufacturing sequence of a semiconductor device according to a fifth embodiment of the present invention.

Figure 5A:
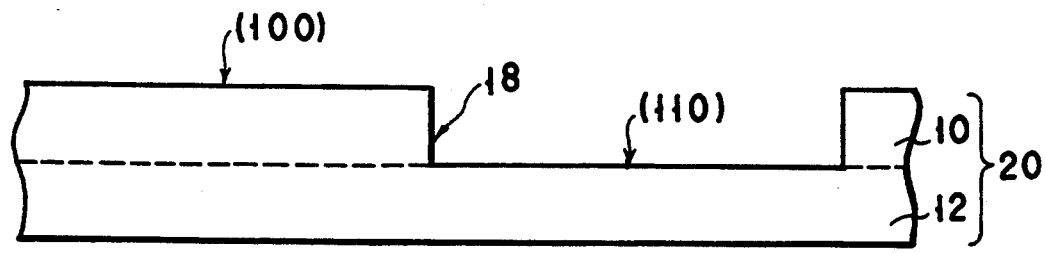

First, a silicon body 20 having portions of different surface orientations is formed by the method explained in FIGS. 1A to 1D (FIG. 5A).

Figure 5B:
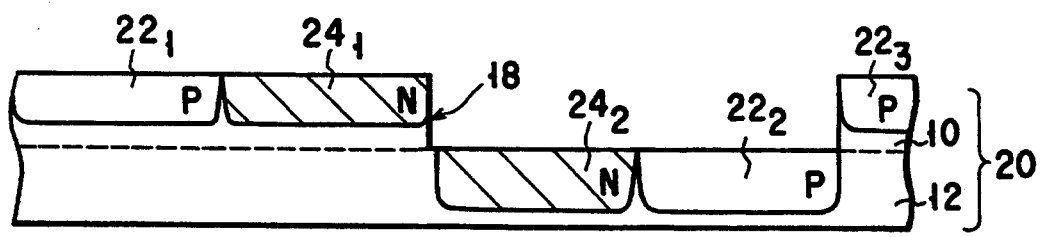

With a photoresist (not shown) as a mask, p-type impurities are introduced into substrates 10 and 12 to form p-type wells $22_1$ and $22_3$ in the substrate 10 and a p-type well $22_2$ in the substrate 12. Then, by using a new photoresist (not shown) as a mask, n-type impurities are introduced into the substrates 10 and 12 to form an n-type well $24_1$ in the substrate 10 and a p-type well $24_2$ in the substrate 12 (FIG. 5B).

Figure 5C:
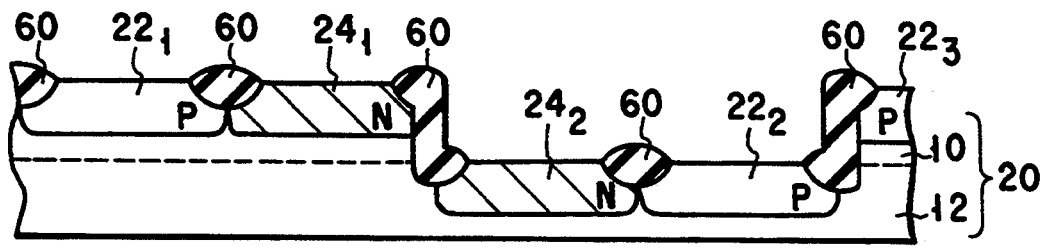

Next, a field oxide film 60 serving as an element separating region is formed on the substrates 10 and 12 by LOCOS techniques (FIG. 5C).

Then, the silicon-exposed surfaces of the substrates 10 and 12 undergo, for example, thermal oxidation to form gate oxide films $62_{(100)}$ and $62_{(110)}$ (FIG. 5D). Since the portion with the (100) surface orientation differs from that with the (110) surface orientation in oxidation ratio, this results in the difference in the film thickness between the oxide film $62_{(100)}$ on the substrate 10 and the oxide film $62_{(110)}$ on the substrate 12. If the thickness of the oxide film on the (100) plane is $T_{OX(100)}$ and that of the oxide film on the (110) plane is $T_{OX(110)}$, their relationship is expressed as:

$$T_{OX(100)} < T_{OX(110)} \tag{1}$$

Then, for example, a polysilicon layer is formed on each of the gate oxide films $62_{(100)}$ and $62_{(110)}$, and the resulting layers are subjected to patterning to form gate electrodes $64_1$ to $64_4$. By using a photoresist (not shown), the gate electrodes $64_1$ and $64_4$, and field oxide film 60 as a mask, n-type impurities are introduced into p-type wells $22_1$ to $22_3$ to form an n-type diffused layer 66 to become the source/drain of the NMOS. After this, by using a new photoresist (not shown), the gate electrodes $64_2$ and $64_3$, and field oxide film 60 as a mask, p-type impurities are introduced into n-type wells $24_1$ to $24_2$ to form a p-type diffused layer 68 to become the source/drain of the PMOS. In this way, NMOSes $26_{(100)}$ and $26_{(110)}$ are formed in the p-type wells $22_1$ to 22₃, and PMOSes 28₍₁₀₀₎ and 28₍₁₁₀₎ are formed in the n-type wells 24₁ and 24₂. This completes the semiconductor device of the fifth embodiment (FIG. 5E).

As described above, an NMOS and a PMOS may be formed in portions of different surface orientations, respectively.

FIGS. 6A to 6E are sectional views in the manufacturing sequence of a semiconductor device according to a sixth embodiment of the present invention.

Figure 6A:
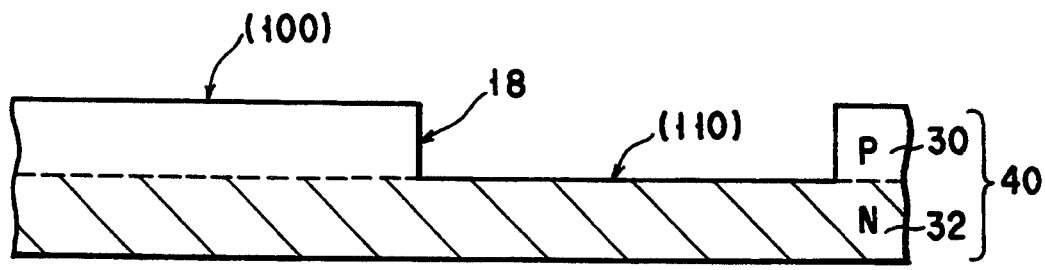
FIGS. 6A to 6E are sectional views in the manufacturing sequence of a semiconductor device according to a sixth embodiment of the present invention.

First, a silicon body 40 having portions of different surface orientations and of different conductivity types, is formed by the method explained in FIGS. 2A to 2D (FIG. 6A).

Figure 6B:
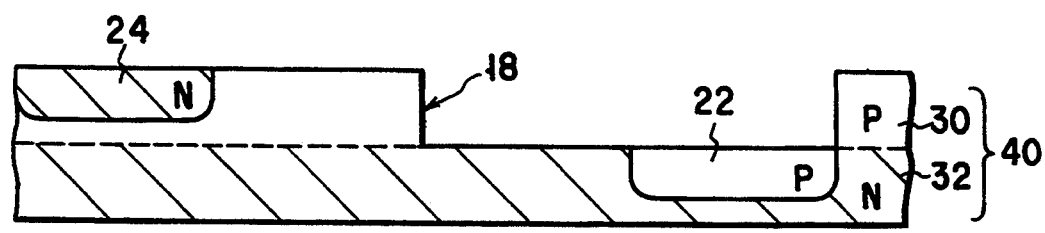

With a photoresist (not shown) as a mask, p-type impurities are introduced into the n-type substrate 32 to form a p-type well 22 in the n-type substrate 32. Then, by using a new photoresist (not shown) as a mask, n-type impurities are introduced into the p-type substrate 30 to form an n-type well 24 in the p-type substrate 30 (FIG. 6B).

Figure 6C:
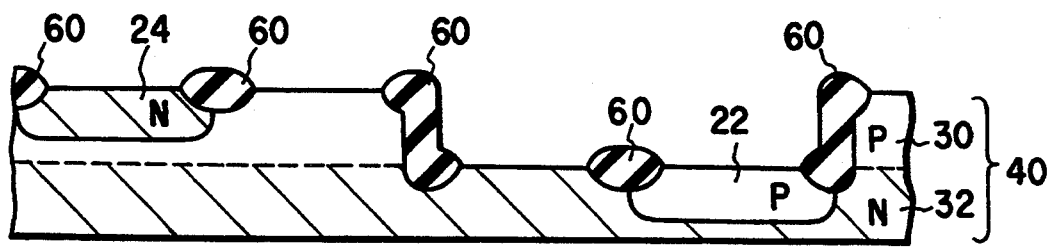

Next, a field oxide film 60 serving as an element separating region is formed on the p-type substrate 30 and n-type substrate 32 by LOCOS techniques (FIG. 6C).

Figure 6D:
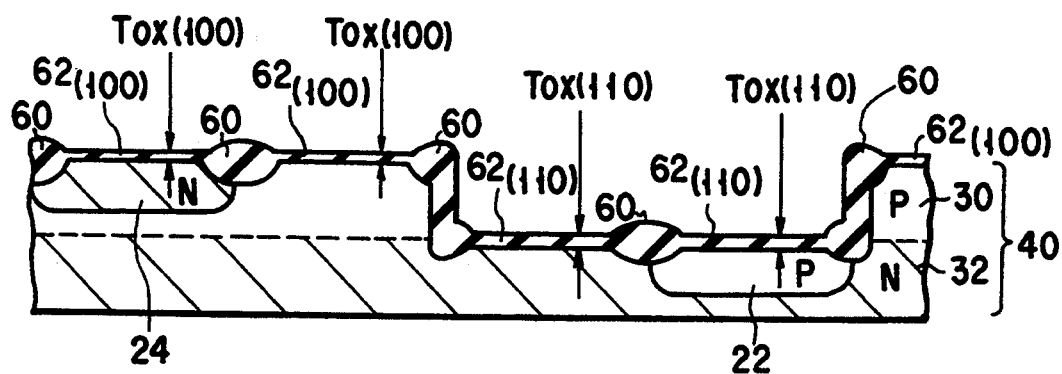

Then, the silicon-exposed surfaces of the p-type substrate 30 and n-type substrate 32 undergo, for example, thermal oxidation to form gate oxide films $62_{(100)}$ and $62_{(110)}$ (FIG. 6D). As explained in FIG. 5D, there is also the relationship between the thickness $T_{OX(100)}$ of the oxide film $62_{(100)}$ formed on a portion with the (100) surface orientation and the thickness $T_{OX(110)}$ of the oxide film $62_{(110)}$ formed on a portion with the (110) surface orientation, as represented by expression (1).

Figure 6E:
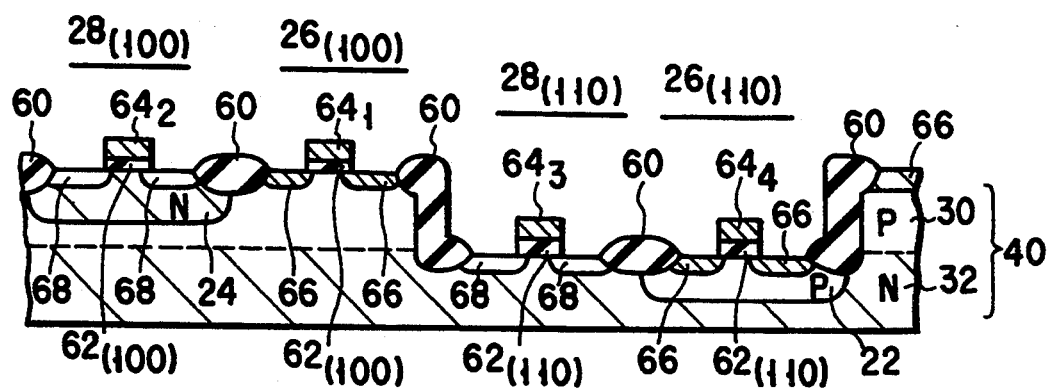

By the same way as explained in FIG. 5E, an NMOS $26_{(100)}$ is formed in the p-type substrate 30, an NMOS $26_{(110)}$ in the p-type well 22, a PMOS $28_{(100)}$ in the n-type well 24, and a PMOS $28_{(110)}$ in the n-type substrate 32. This completes the semiconductor device of the sixth embodiment (FIG. 6E).

As described above, an NMOS and a PMOS may be formed in the portions of different surface orientations and of different conductivity types, respectively.

Figure 7:
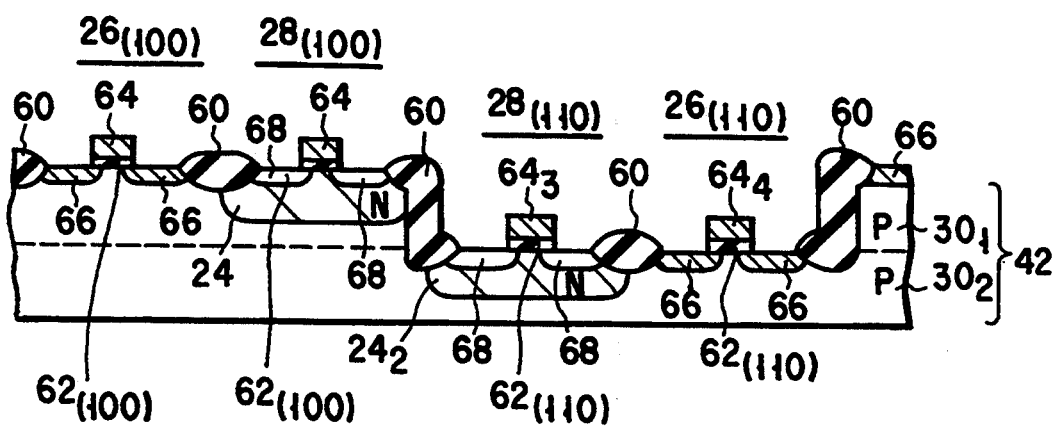
FIG. 7 is a sectional view of a semiconductor device according to a seventh embodiment of the present invention.

FIG. 7 is a sectional view of a semiconductor device according to a seventh embodiment of the present invention.

As shown in FIG. 7, a p-type silicon substrate 30₁ may be laminated to a p-type silicon substrate 30₂ to form a silicon body 42 of the p-type conductivity having different surface orientation portions, and then an n-type well 24₁ be formed at the p-type substrate 30₁ with the (100) plane exposed and an n-type well 24₂ at the p-type substrate 30₂ with the (110) plane exposed, and finally an NMOS $26_{(100)}$, an NMOS $26_{(110)}$, a PMOS $28_{(100)}$, and a PMOS $28_{(110)}$ be formed.

The p-type body 42 is formed by the method described in FIGS. 1A to 1D, especially, by making the substrates 10 and 12 of the p-type.

FIGS. 8A to 8E are sectional views in the manufacturing sequence of a semiconductor device according to an eighth embodiment of the present invention.

Figure 8A:
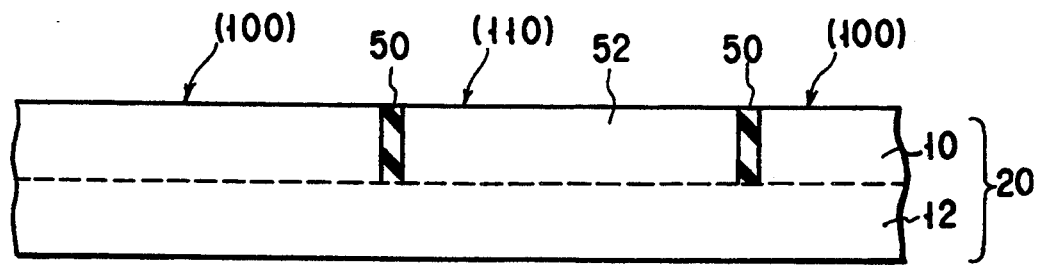
FIGS. 8A to 8E are sectional views in the manufacturing sequence of a semiconductor device according to an eighth embodiment of the present invention.

First, a silicon body 20 having portions of different surface orientations, almost flush with each other, is formed by the method explained referring to FIGS. 3A to 3E (FIG. 8A).

Figure 8B:
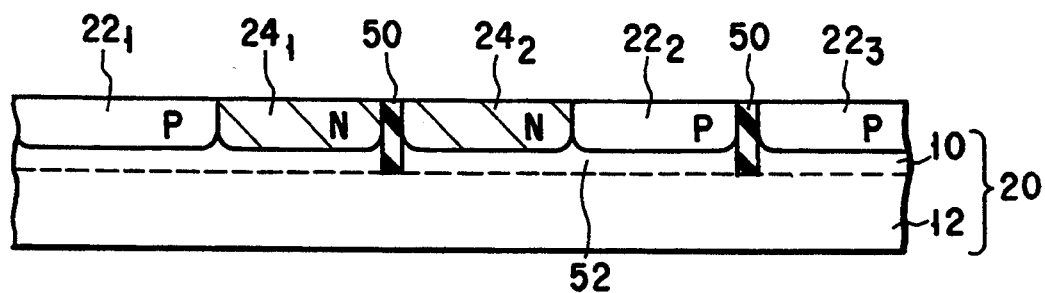

With a photoresist (not shown) as a mask, p-type impurities are introduced into the substrate 10 and epitaxial silicon layer 52 to form p-type wells 22₁ and 22₃ in the substrate 10 and a p-type well 22₂ in the epitaxial silicon layer 52. Then, by using a new photoresist (not shown) as a mask, n-type impurities are introduced into the substrate 10 and epitaxial silicon layer 52 to form an n-type well 24₁ in the substrate 10 and a p-type well 24₂ in the epitaxial silicon layer 52 (FIG. 8B).

Figure 8C:
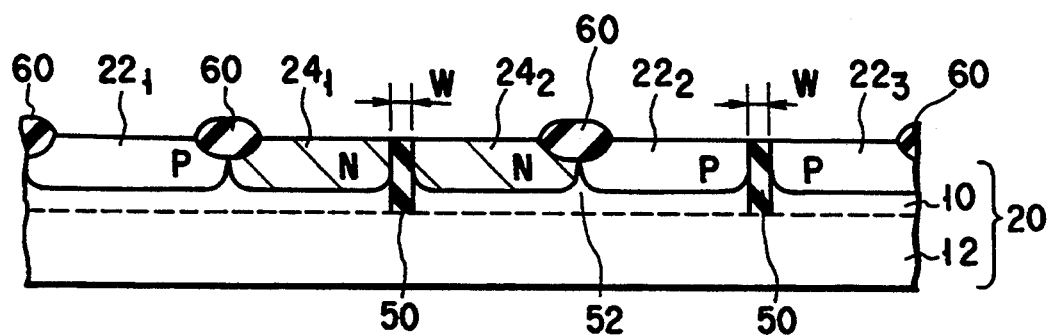

Next, a field oxide film 60 serving as an element separating region is formed on the substrate 10 and epitaxial silicon layer 52 by LOCOS techniques (FIG. 8C). Here, between the substrate 10 and epitaxial silicon layer 52 is formed a silicon nitride film 50 with a film thickness of W, which insulates the substrate 10 from the epitaxial silicon layer 52. For this reason, it is not necessary to introduce the field oxide film 60 to this region.

Figure 8D:
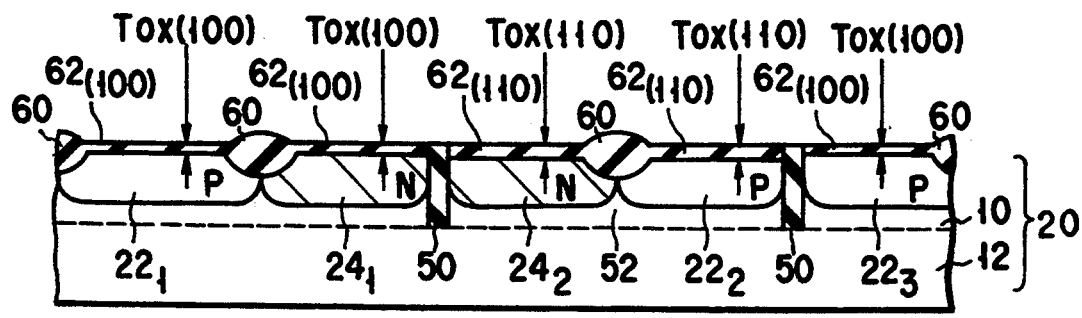

Then, the silicon-exposed surfaces of the substrate 10 and epitaxial silicon layer 52 undergo, for example, thermal oxidation to form gate oxide films $62_{(100)}$ and $62_{(110)}$ (FIG. 8D). As explained in FIG. 5D, there is the relationship between the thickness $T_{OX(100)}$ of the oxide film $62_{(100)}$ on the substrate with the (100) surface orientation and the thickness $T_{OX(110)}$ of the oxide film $62_{(110)}$ on the epitaxial silicon layer 52 with the (110) surface orientation, as represented by expression (1).

Figure 8E:
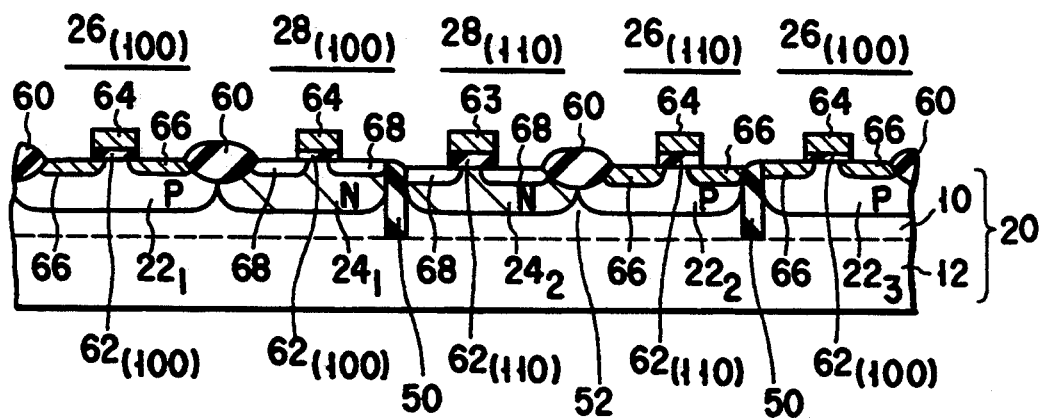

By the same way as explained in FIG. 5E, an NMOS $26_{(100)}$ is formed in each of the p-type wells 22₁ and 22₃, an NMOS $26_{(110)}$ in the p-type well 22₂, a PMOS $28_{(100)}$ in the n-type well 24₁, and a PMOS $28_{(110)}$ in the n-type well 24₂. This completes the semiconductor device of the eighth embodiment (FIG. 8E).

As described above, by using the silicon body 20 where different surface orientation portions are almost flush with each other, an NMOS and a PMOS may be formed in the portions of different surface orientations, respectively.

FIGS. 9A to 9E are sectional views in the manufacturing sequence of a semiconductor device according to a ninth embodiment of the present invention.

First, a silicon body 40 having portions of different surface orientations and of different conductivity types, almost flush with each other, is formed by the method explained in FIGS. 4A to 4E (FIG. 9A).

With a photoresist (not shown) as a mask, p-type impurities are introduced into the n-type epitaxial silicon layer 54 to form a p-type well 22. Then, by using a new photoresist (not shown) as a mask, n-type impurities are introduced into the p-type substrate 30 to form an n-type well 24 (FIG. 9B).

Next, a field oxide film 60 serving as an element separating region is formed on the p-type substrate 30 and n-type epitaxial silicon layer 54 by LOCOS techniques (FIG. 9C). Since a silicon nitride film 50 with a film thickness of W is formed between the p-type substrate 30 and epitaxial silicon layer 54, it is not necessary to introduce the field oxide film 60 to this particular portion, as explained in FIG. 8C.

Figure 9D:
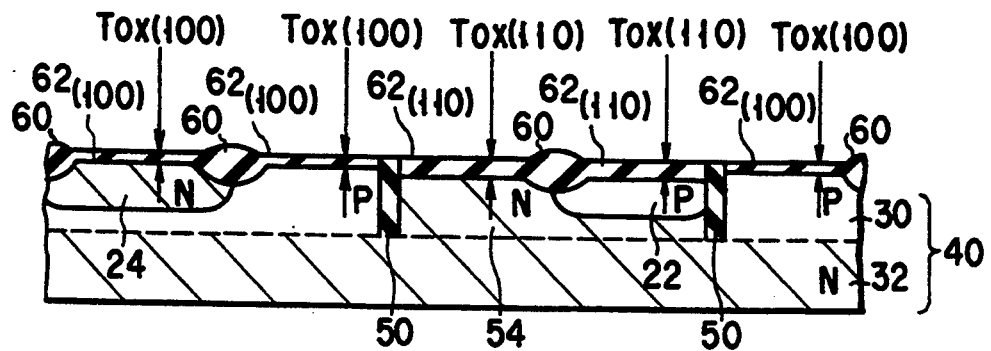

Then, the silicon-exposed surfaces of the p-type substrate 30 and n-type epitaxial silicon layer 54 undergo, for example, thermal oxidation to form gate oxide films $62_{(100)}$ and $62_{(110)}$ (FIG. 9D). As explained in FIG. 5D, there is the relationship between the thickness $T_{OX(100)}$ of the oxide film $62_{(100)}$ and the thickness $T_{OX(110)}$ of the oxide film $62_{(110)}$, as represented by expression (1).

Figure 9E:
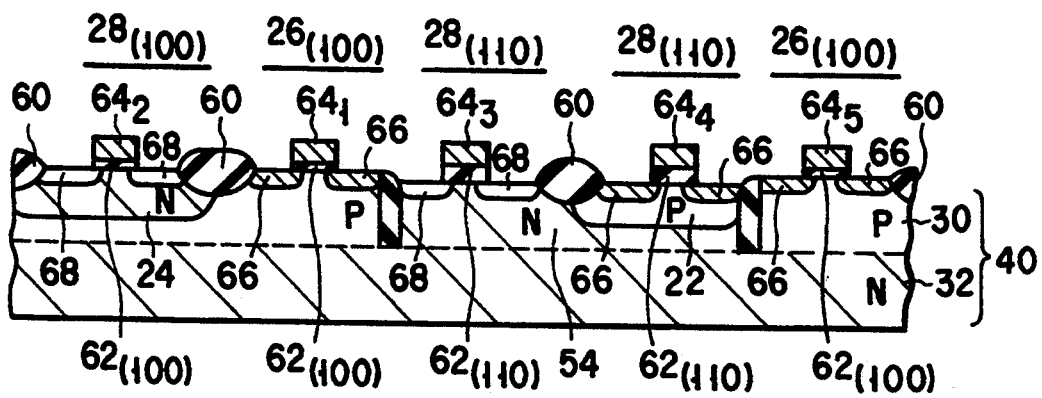

By the same way as explained in FIG. 5E, an NMOS $26_{(100)}$ is formed in the p-type substrate 30, an NMOS $26_{(110)}$ in the p-type well 22, a PMOS $28_{(100)}$ in the n-type well 24, and a PMOS $28_{(110)}$ in the n-type epitaxial silicon layer 54. This completes the semiconductor device of the ninth embodiment (FIG. 9E).

As described above, by using the silicon body 40 where different surface orientation portions of different conductivity types are almost flush with each other, an NMOS and a PMOS may be formed in the portions of different conductivity types, respectively.

Figure 10:
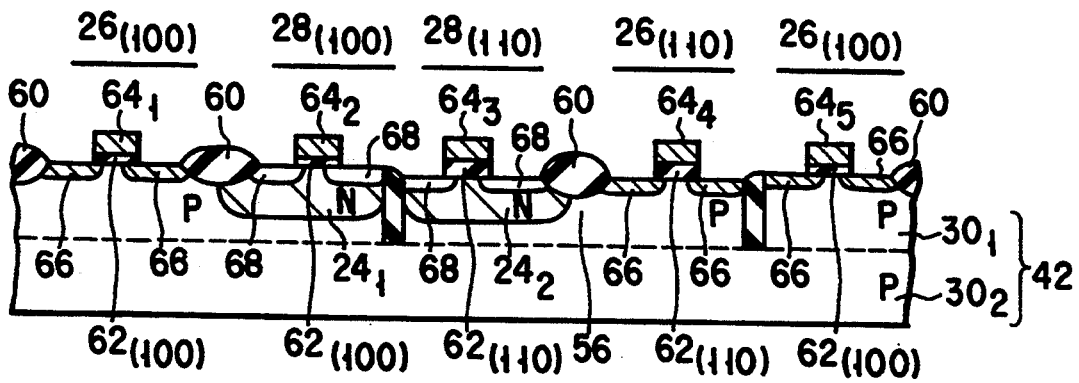
FIG. 10 is a sectional view of a semiconductor device according to a tenth embodiment of the present invention.

FIG. 10 is a sectional view of a semiconductor device according to a tenth embodiment of the present invention.

As shown in FIG. 10, a p-type silicon substrate $30_1$ may be laminated to a p-type silicon substrate $30_2$, and then a p-type epitaxial silicon layer 56 be grown on the substrate $30_2$ to form a silicon body 42 of the p-type conductivity with different surface orientation portions almost flush with each other, and finally an NMOS $26_{(100)}$, an NMOS $26_{(110)}$, a PMOS $28_{(100)}$, and a PMOS $28_{(110)}$ be formed in the resulting body.

Next explained will be an example of applying the semiconductor devices described in the first to tenth embodiments to a practical device.

FIG. 11 is a typical block diagram of a memory cell portion of a dynamic RAM (hereinafter, referred to as the DRAM), and FIG. 12 is a typical block diagram of a memory cell portion of a static RAM (hereinafter, referred to as the SRAM).

As shown in FIGS. 11 and 12, dynamic memory cells 100 or static memory cells 102 are connected at the intersections of word lines WL0 to WL3 and bit lines $BL_0$, $BL_0^-$ (the symbol − means that the inverted signal is supplied), and $BL_1$, $BL_1^-$. The bit line pairs $BL_0$, $BL_0^-$ and $BL_1$, $BL_1^-$ of the DRAM and SRAM are generally connected to a sense circuit 104 that performs differential amplification of the data signal flowing through the bit line pair.

Figure 13:
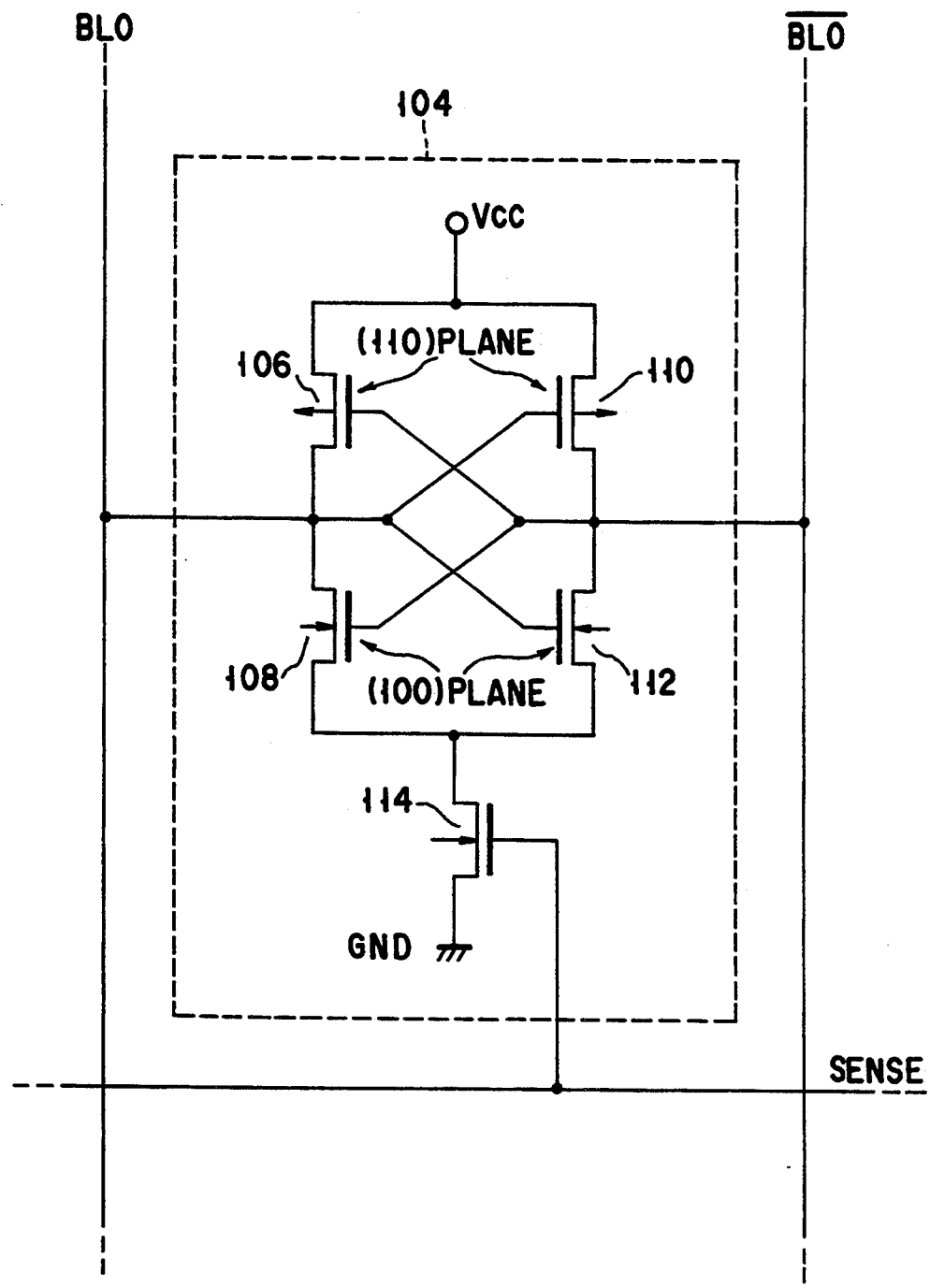
FIG. 13 is a diagram of the sense circuit shown in FIGS. 11 and 12.

FIG. 13 is a diagram showing a practical circuit configuration of the sense circuit 104 shown in FIGS. 11 and 12.

As shown in FIG. 13, the drain of PMOS 106 and that of NMOS 108 are connected to bit line $BL_0$, one part of the bit line pair, to which the gate of PMOS 110 and that of NMOS 112 are also connected. The drain of PMOS 110 and that of NMOS 112 are connected to bit line $BL_0^-$, the other part of the bit line pair, to which the gate of PMOS 106 and that of NMOS 108 are also connected. The sources of PMOSes 106 and 110 are each connected to a high-potential power supply VCC. The sources of NMOSes 108 and 112 are connected to a low-potential power supply, for example, the ground GND, via the current path of an NMOS 114 that, receiving the sense signal SENSE at its gate, switches the sense circuit 104.

With the sense circuit 104 thus constructed, equalizing the performance of PMOS with that of NMOS enables an improvement in the performance of the sense circuit 104. Taking into account the fact that in present-day MOSFETs, the performance of NMOS is superior to that of PMOS, it is the best way to improve the performance of PMOS in order to equalize PMOS and NMOS in performance.

In view of this point, by making PMOSes 106 and 110 of PMOS $28_{(110)}$, using the semiconductor devices explained in the first to tenth embodiments, the performance can be improved. Constructing NMOSes 108 and 112 of NMOS $26_{(100)}$ enables the equalization of PMOS and NMOS in performance.

FIG. 14 is a diagram showing a first practical circuit configuration of the static memory cell 102 shown in FIG. 12.

As shown in FIG. 14, the drain of NMOS 116 is connected to a high-potential power supply VCC via a resistance 117, as well as to the gate of NMOS 118. The source of NMOS 116 is connected to a low-potential power supply, for example, the ground GND. The drain of NMOS 118 is connected to the high-potential power supply VCC via a resistance 119, and its source is connected to the ground GND and the gate of NMOS 116. These NMOSes 116 and 118, resistances 117 and 119 constitute a latch circuit, which latches the data for subsequent use. The drain of NMOS 116 is connected to bit line $BL_0$ via the current path of a data transfer transistor NMOS 120. Similarly, the drain of NMOS 118 is connected to bit line $BL_0^-$ via the current path of a data transfer transistor NMOS 122. The gate of each of NMOSes 120 and 122 is connected to word line WL.

With the static memory cell 102 thus constructed, by increasing the ratio $\beta_T/\beta_D$ of the driving capability $\beta_T$ of the data transfer transistors, or NMOSes 120 and 122 to the driving capability $\beta_D$ of the data-driving transistors, or NMOSes 116 and 118, the stability of the memory cell 102 is improved.

Especially by using the semiconductor devices explained in the fifth to tenth embodiments, NMOSes 120 and 122 (data transfer transistors) are made up of NMOS $26_{(110)}$, which provides a thicker gate oxide film, while NMOSes 116 and 118 (data-driving transistors) are composed of NMOS $26_{(100)}$, which provides a thinner gate oxide film. With this arrangement, a difference in the gate oxide film thickness creates a difference in the driving capability of MOSFET, thereby increasing the ratio $\beta_T/\beta_D$.

Figure 15:
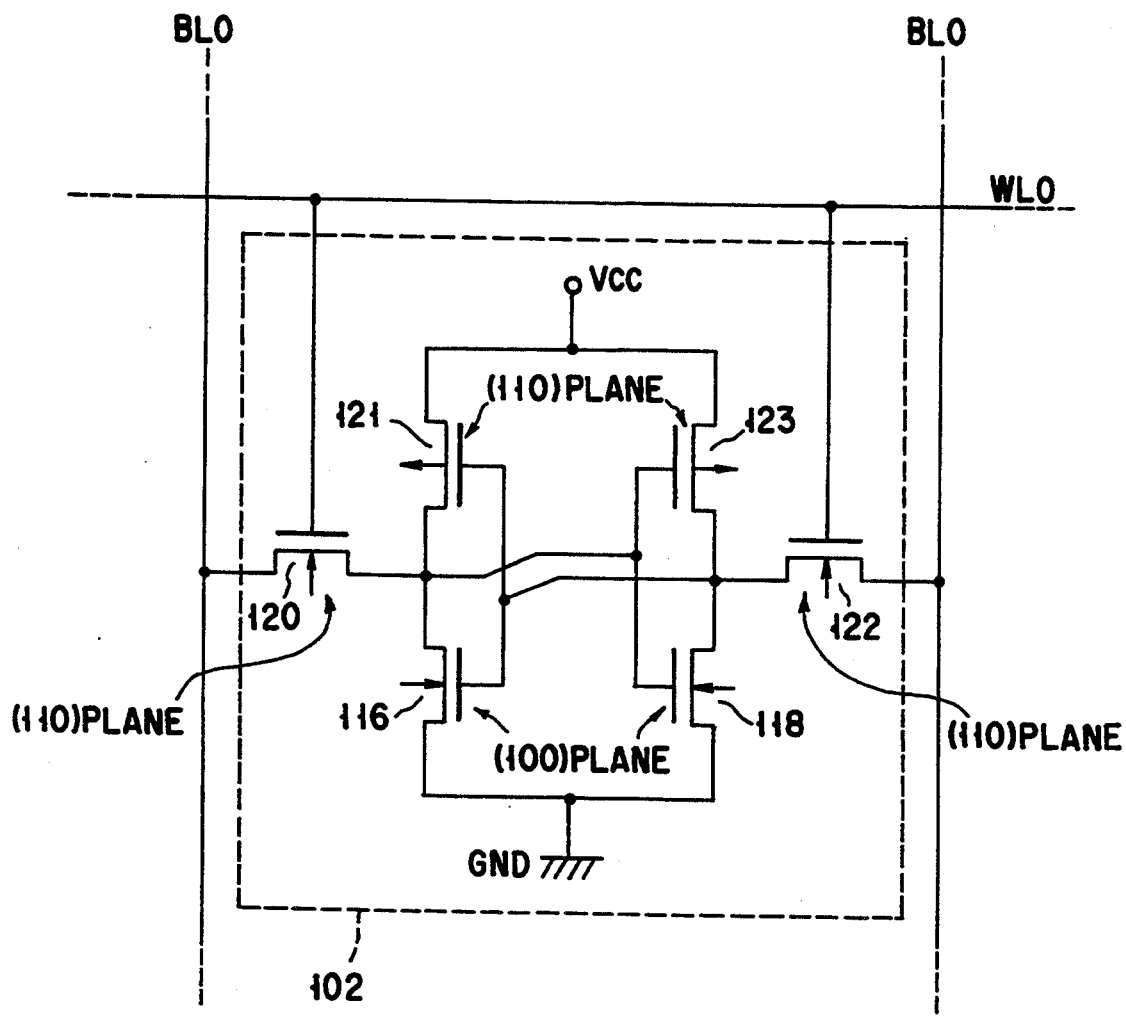
FIG. 15 is another circuit diagram of the static memory cell of FIG. 12.

FIG. 15 is a diagram showing a second practical circuit configuration of the static memory cell 102 shown in FIG. 12.

As shown in FIG. 15, NMOSes 116 and 118, and PMOSes 121 and 123 constitute a latch circuit, which latches the data for subsequent use.

With a cell of such a CMOS circuit configuration, by making smaller the element separating region that separates the PMOS formation region from the NMOS formation region, it is possible to efficiently reduce the area per cell.

Especially by using the semiconductor devices explained in the third, fourth, eighth, ninth, and tenth embodiments, NMOSes 116 and 118, and PMOSes 121 and 123 are formed in different surface orientation portions, respectively.

With the device of such a configuration, the NMOS formation region (such as the p-type well 22 or p-type silicon substrate 30) is separated from the PMOS formation region (such as the n-type well 24 or n-type epitaxial layer 54) by silicon nitride film 50. That is, using the nitride film 50 as the element-separating region makes the size of the region smaller than that formed by, for example, LOCOS techniques, thereby reducing the cell area. This provides a device construction suitable for a high-capacity static RAM, for example.

The effect of making the element separating region finer can be obtained with not only the static memory cell but also devices of other CMOS circuit arrangements.

The same effect is, of course, obtained when the silicon nitride film 50 separates elements of the same conductivity type from each other, such as NMOS on the (100) plane from NMOS on the (110) plane, or PMOS on the (100) plane from PMOS on the (110) plane, in addition to separating the elements, such as NMOS and PMOS, of the CMOS circuit.

Applying the memory cell of FIG. 15 to the present invention provides the following construction, for example.

Taking into account the difference in performance between NMOS and PMOS in the latch circuit, NMOSes 116 and 118 are composed of NMOS $26_{(100)}$, and PMOSes 121 and 123 are made up of PMOS $28_{(110)}$.

Data transfer NMOSes 120 and 122 are made up of NMOS $26_{(110)}$, which provides a thicker gate oxide film, taking into account the cell stability.

FIG. 16 is a typical block diagram of a memory cell portion and a row decoder portion of a programmable ROM (hereinafter, referred to as the PROM).

Presently, PROMs include EPROMs, which electrically write the data and erase it by radiation of ultraviolet rays, and EEPROMs, which electrically write and erase the data.

In such PROMs, when the data is written or erased, the potential of the word line and bit line is raised.

For example, in FIG. 16 showing mainly the connection of the memory cells 130 with the row decoder 132, level shifters 134 are provided between the outputs of AND gates 133 constituting the row decoder 132 and word lines $WL_0$ to $WL_3$ in order to raise the potential of word lines $WL_0$ to $WL_3$ for activation.

FIG. 17 is a diagram showing a practical circuit configuration of the AND gate 133 and level shifter 134 of FIG. 16.

As shown in FIG. 17, the AND gate 133 is constructed in such a manner that the source and drain of PMOS 140 are connected to the source and drain of PMOS 142, respectively, and a NAND gate composed of NMOSes 144 and 146 whose current paths are connected in series with each other is connected between the common drain and the low-potential power supply, for example, the ground GND, and then the output of the NAND gate is inverted by an inverter made up of PMOS 148 and NMOS 150. Address signal $A_0$ is supplied to the gates of PMOS 142 and NMOS 146, and address signal $A_1$ to the gates of PMOS 140 and NMOS 144.

The level shifter 134 is composed as follows. The source of PMOS 152 is connected to the high-potential power supply VCC or a terminal Vsw to which a program potential VPP is selectively supplied, and its drain is connected to the drain of NMOS 154. PMOS 152 also has its gate connected to the drain of PMOS 156 as well as the drain of NMOS 158 and word line $WL_3$. NMOS 154 has its source connected to the drains of PMOS 148 and NMOS 150 of the NAND gate 133, and its gate supplied with the high-potential power supply VCC. The gate of PMOS 156 is connected to the drains of PMOS 152 and NMOS 154. NMOS 158 has its gate connected to the source of NMOS 154, and its source connected to a low-potential power supply, for example, the ground GND.

With the level shifter 134 of the above arrangement, receiving a high level signal (VCC) from the NAND gate 133, NMOS 158 turns on. This causes PMOS 152 to turn on, bringing word line $WL_3$ into the low level. Contrarily, receiving a low level signal from the NAND gate 133, NMOS 158 turns off. This causes NMOS 154 to turn on, which makes PMOS 156 turn on, bringing word line $WL_3$ into the high level (VCC or VPP).

With the level shifter thus constructed, there may be a case where a very high voltage, that is, VPP (12 to 20 V) is applied to PMOSes 152 and 156, and NMOSes 154 and 158 constituting this circuit. For this reason, it is desirable that these MOSFETs should be made up of MOSFETs with high breakdown voltage.

In contrast, to increase the integration, it is desirable that PMOSes 140, 142 and 148, and NMOSes 144, 146 and 150 constituting the row decoder 133 should be made up of MOSFETs of a fine construction. Making the MOSFET finer creates the problem of decreasing the breakdown voltage. Consequently, constructing the row decoder 133 and level shifter 134 of MOSFETs of the same configuration is expected to prevent the PROM from having a larger capacity.

Accordingly, especially by using the semiconductor devices explained in the fifth to tenth embodiments, PMOSes 152 and 156, and NMOSes 154 and 158 are made up of NMOS $26_{(110)}$ and PMOS 28 (110), which provides a thicker gate oxide film, and PMOSes 140, 142 and 148, NMOSes 144, 146 and 150 are composed of NMOS $26_{(100)}$ and PMOS $28_{(100)}$ with the thinner gate oxide film. This makes it possible to make the row decoder 133 of MOSFETs whose gate oxide film is thin enough for finer design, and to construct the level shifter 134 of MOSFETs whose thick gate oxide film provides a high breakdown voltage.

Figure 18:
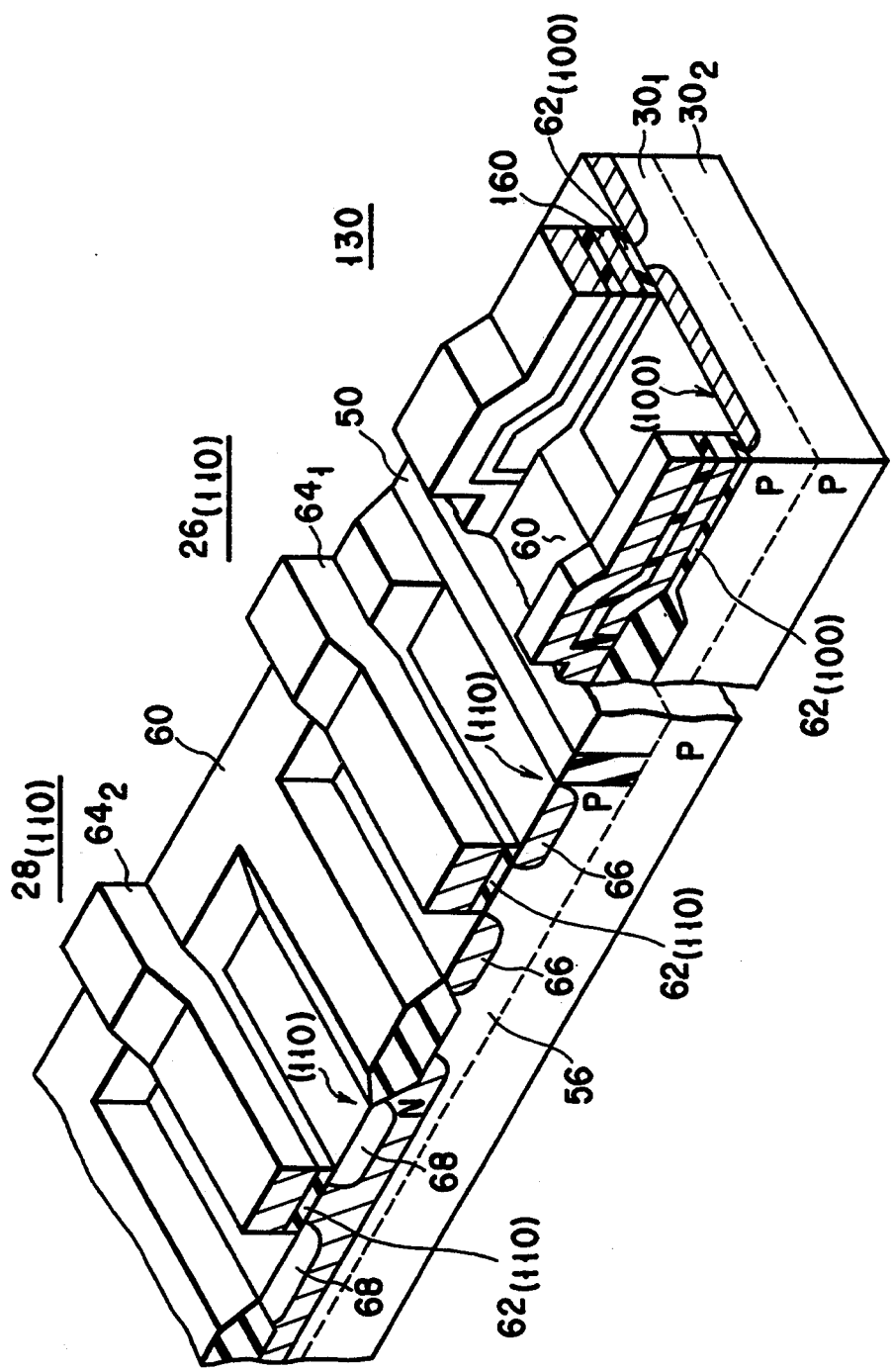
FIG. 18 is a perspective view, in cross section, of a part of the MOSFETs constituting a memory cell portion and peripheral circuit portion of the programmable ROM of FIG. 16.

FIG. 18 is a perspective view, in cross section, of a portion of the MOSFET constituting a memory cell portion and peripheral circuit portion of the PROM of FIG. 16.

As shown in FIG. 18, it is known that in a PROM memory, especially in an EEPROM, a first gate insulating film between the floating gate electrode 160 and p-type substrate $30_1$ is made thin enough to become a tunnel insulating film.

Particularly by using the semiconductor devices explained in the fifth to tenth embodiments, a memory cell 130 is formed on the p-type substrate $30_1$ with the (100) surface orientation, and the MOSFETs (PMOS $26_{(110)}$ and NMOS $28_{(110)}$) constituting the peripheral circuit portions of the row decoder and others are formed on, for example, the p-type epitaxial silicon layer 56 with the (110) surface orientation.

With such a configuration, a gate insulting film can be formed so that the gate oxide film $62_{(100)}$ may differ from the gate oxide film $62_{(110)}$ in film thickness. This makes it possible to form a gate insulating film so thin that a tunnel phenomenon of electrons takes place at the memory cell 130, and at the peripheral circuit portion, to make a gate insulating film thick enough to prevent a tunnel phenomenon from occurring during the normal circuit operation.

The present invention is not limited to the embodiments described so far, but may be practiced or embodied in still other ways without departing from the spirit or essential character thereof. For instance, the silicon nitride film 50, which is formed so that the epitaxial silicon layers 52, 54, and 56 formed on the substrate 12 or 32 may be less affected by the crystal orientations of the substrate 10 or 30 during their growth, may be made up of other insulating films such as a silicon oxide film.

Further, it is possible to reverse the surface orientation of the substrates 10 and 30 and that of the substrates 12 and 32, that is, to give the substrates 10 and 30 the (110) surface orientation, and the substrates 12 and 32 the (100) surface orientation. The surface orientation is not restricted to (100) and (110). Other surface orientations such as (111) may be used, taking into account the characteristics of an active element to be made, oxidation rate, and others.

It is also possible to use three substrates of different surface orientations to form a semiconductor body having three surface orientation portions, such as (100), (110), and (111).

In addition, other semiconductor materials may be used instead of silicon.

Further, it is, of course, possible to form other active elements such as bipolar transistors, in addition to MOSFFETs, on the silicon body with different surface orientation portions of the present invention. For instance, when surface orientation dependence is found in the characteristics of a bipolar transistor, a bipolar transistor may be formed in each portion with the surface orientation assuring the optimum characteristics. This is also with the scope of the present invention.

As explained so far, with the present invention, it is possible to provide a semiconductor body capable of allowing semiconductor elements of different conductivity types not only to display their full performance but also to form semiconductor elements with the optimum characteristics into a device, its manufacturing method, and a semiconductor device using the body.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor body comprising:
   a first semiconductor substrate having a first and a second main surface, a first surface orientation appearing at said first main surface;
   a second semiconductor substrate having a third main surface, a second surface orientation different from said first surface orientation appearing at the third main surface, and the third main surface being in contact with the second main surface of said first semiconductor substrate; and
   at least one opening made in said first semiconductor substrate, at which the third main surface of said second semiconductor substrate appears.

2. A semiconductor body according to claim 1, further comprising:
   a first element formation surface formed at said first main surface; and
   a second element formation surface formed at said third main surface appearing in said opening.

3. A semiconductor body according to claim 2, wherein said first semiconductor substrate is a first-conductivity type semiconductor substrate, and said second semiconductor substrate is a second-conductivity type semiconductor substrate.

4. A semiconductor body according to claim 2, wherein said first semiconductor substrate and said second semiconductor substrate are semiconductor substrates of the same conductivity type.

5. A semiconductor body according to claim 1, further comprising:
   a semiconductor layer formed in said opening, said second surface orientation appearing at its surface;
   a first element formation surface formed at said first main surface; and
   a second element formation surface formed at said semiconductor layer.

6. A semiconductor body according to claim 5, wherein said first semiconductor substrate is a first-conductivity type semiconductor substrate, and said second semiconductor substrate is a second-conductivity type semiconductor substrate.

7. A semiconductor body according to claim 5, wherein said first semiconductor substrate and said second semiconductor substrate are semiconductor substrates of the same conductivity type.

8. A semiconductor device comprising:
   a first semiconductor substrate having a first and a second main surface, a first surface orientation appearing at said first main surface;
   a second semiconductor substrate having a third main surface, a second surface orientation different from said first surface orientation appearing at the third main surface, and the third main surface being in contact with the second main surface of said first semiconductor substrate;
   at least one opening made in said first semiconductor substrate, at which the third main surface of said second semiconductor substrate appears;
   a first element formation surface formed at said first main surface;
   a second element formation surface formed at said third main surface appearing in said opening;
   a first semiconductor element formed at said first element formation surface; and
   a second semiconductor element formed at said second element formation surface.

9. A semiconductor device according to claim 8, wherein said first semiconductor element is a first-conductivity type semiconductor element, and said second semiconductor element is a second-conductivity type semiconductor element.

10. A semiconductor device according to claim 8, wherein said first semiconductor element contains a first-conductivity type semiconductor element and a second-conductivity type semiconductor element, and said second semiconductor element contains a first-conductivity type semiconductor element and a second-conductivity type semiconductor element.

11. A semiconductor device comprising:
    a first semiconductor substrate having a first and a second main surface, a first surface orientation appearing at said first main surface;
    a second semiconductor substrate having a third main surface, a second surface orientation different from said first surface orientation appearing at the third main surface, and the third main surface being in contact with the second main surface of said first semiconductor substrate;
    at least one opening made in said first semiconductor substrate, at which the third main surface of said second semiconductor substrate appears;
    a semiconductor layer formed in said opening, whose surface has said second surface orientation;
    a first element formation surface formed at said first main surface;
    a second element formation surface formed at said third main surface appearing in said opening;
    a first semiconductor element formed at said first element formation surface; and
    a second semiconductor element formed at said second element formation surface.

12. A semiconductor device according to claim 11, wherein said first semiconductor element is a first-conductivity type semiconductor element, and said second semiconductor element is a second-conductivity type semiconductor element.

13. A semiconductor device according to claim 11, wherein said first semiconductor element contains a first-conductivity type semiconductor element and a second-conductivity type semiconductor element, and said second semiconductor element contains a first-conductivity type semiconductor element and a second-conductivity type semiconductor element.

* * * * *